United States Patent
Gupta et al.

(10) Patent No.: US 11,018,684 B1
(45) Date of Patent: May 25, 2021

(54) HYBRID PIPELINE ANALOG-TO-DIGITAL CONVERTER

(71) Applicant: NXP B.V., Eindhoven (NL)

(72) Inventors: Sushil Kumar Gupta, Bangalore (IN); Pankaj Agrawal, Bangalore (IN); Ashish Panpalia, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/005,076

(22) Filed: Aug. 27, 2020

(51) Int. Cl.
*H03M 1/46* (2006.01)
*H03M 1/74* (2006.01)
*H03M 1/68* (2006.01)
*H03M 1/12* (2006.01)

(52) U.S. Cl.
CPC ......... *H03M 1/462* (2013.01); *H03M 1/1245* (2013.01); *H03M 1/68* (2013.01); *H03M 1/74* (2013.01)

(58) Field of Classification Search
CPC ...... H03M 1/462; H03M 1/68; H03M 1/1245; H03M 1/74
See application file for complete search history.

(56) References Cited

U.S. PATENT DOCUMENTS

| 7,978,117 | B2  |   | 7/2011  | Jeon et al. |              |
|-----------|-----|---|---------|-------------|--------------|
| 10,536,161| B1  | * | 1/2020  | Zhang       | H03M 1/1245  |
| 10,541,700| B2  | * | 1/2020  | Naru        | H03M 1/164   |
| 10,826,516| B2  | * | 11/2020 | Lee         | H03M 1/1038  |

* cited by examiner

*Primary Examiner* — Brian K Young
(74) *Attorney, Agent, or Firm* — Rajeev Madnawat

(57) ABSTRACT

A pipeline analog-to-digital converter (ADC) includes a hybrid multiplying digital-to-analog converter (MDAC) that includes multiple digital-to-analog converters (DACs), at least one conversion circuit, and at least one amplifier such that a number of conversion circuits and a number of amplifiers is less than a number of DACs. Each DAC is configured to receive an analog input signal in non-overlapping durations of a clock signal and generate a corresponding analog output signal. At least one of the conversion circuits is coupled with at least two DACs, and each conversion circuit is configured to perform conversion operation on a corresponding analog output signal to generate digital signals. At least one of the amplifiers is coupled with at least two DACs, and each amplifier is configured to perform amplification operation on a corresponding analog output signal.

20 Claims, 10 Drawing Sheets

HYBRID PIPELINE ANALOG-TO-DIGITAL CONVERTER

BACKGROUND

The present disclosure relates generally to electronic circuits, and, more particularly, to analog-to-digital converters.

A pipeline analog-to-digital converter (ADC) includes various ADC stages to achieve a high speed of operation and a high resolution of the ADC. A high-powered sub-ADC, i.e., multiple individual ADCs, and a high-powered multiplying digital-to-analog converter (MDAC) are typically implemented in the ADC stages. The sub-ADC and the MDAC utilize a first half cycle of a clock signal to perform sampling and conversion operations on an analog input signal and a second half cycle of the clock signal to perform an amplification operation on a residue signal that is generated after the conversion operation on the analog input signal. To perform the sampling, conversion, and amplification operations in a single cycle of the clock signal, the sub-ADC and the MDAC implement a high-gain closed-loop amplifier due to which a cost and a power consumption of the pipeline ADC is high. Thus, there exists a need for a pipeline ADC that has a low cost and consumes low power as compared to the conventional pipeline ADC.

SUMMARY

In one embodiment, a pipeline analog-to-digital converter (ADC) is disclosed. The pipeline ADC comprises a first hybrid multiplying digital-to-analog converter (MDAC) and a second ADC. The first hybrid MDAC comprises first through third digital-to-analog converters (DACs), first and second conversion circuits, and an amplifier. The first through third DACs are configured to receive an analog input signal during first through third durations of a clock signal, and generate first through third analog output signals, respectively. The first through third durations are non-overlapping durations. The first conversion circuit is coupled with the first and second DACs, and configured to receive the first and second analog output signals and generate first and second digital signals during fourth and fifth durations of the clock signal, respectively. The fourth and fifth durations are non-overlapping durations. The second conversion circuit is coupled with the third DAC, and configured to receive the third analog output signal and generate a third digital signal during a sixth duration of the clock signal. The sixth duration partially overlaps with at least one of the fourth and fifth durations. The amplifier is coupled with the first through third DACs, and configured to receive the first through third analog output signals and amplify at least one of the first through third analog output signals to generate an amplified analog signal during seventh through ninth durations of the clock signal, respectively. The seventh through ninth durations are non-overlapping durations. The second ADC is coupled with the amplifier, and configured to receive the amplified analog signal and generate a fourth digital signal.

In another embodiment, a pipeline ADC is disclosed. The pipeline ADC comprises a first hybrid MDAC and a second ADC. The first hybrid MDAC comprises first through third DACs, a conversion circuit, and first and second amplifiers. The first through third DACs are configured to receive an analog input signal during first through third durations of a clock signal, and generate first through third analog output signals, respectively. The first through third durations are non-overlapping durations. The conversion circuit is coupled with the first through third DACs, and configured to receive the first through third analog output signals and generate first through third digital signals during fourth through sixth durations of the clock signal, respectively. The fourth through sixth durations are non-overlapping durations. The first amplifier is coupled with the first and second DACs, and configured to receive the first and second analog output signals and amplify at least one of the first and second analog output signals to generate a first amplified analog signal during seventh and eighth durations of the clock signal, respectively. The seventh and eighth durations are non-overlapping durations. The second amplifier is coupled with the third DAC, and configured to receive the third analog output signal and amplify the third analog output signal to generate a second amplified analog signal during a ninth duration of the clock signal. The ninth duration partially overlaps with at least one of the seventh and eighth durations. The second ADC is coupled with the first and second amplifiers, and configured to receive at least one of the first and second amplified analog signals and generate a fourth digital signal based on at least one of the first and second amplified analog signals.

In yet another embodiment, a pipeline ADC is disclosed. The pipeline ADC comprises a first hybrid MDAC and a second ADC. The first hybrid MDAC comprises first through fourth DACs, first and second conversion circuits, and first and second amplifiers. The first through fourth DACs are configured to receive an analog input signal during first through fourth durations of a clock signal, and generate first through fourth analog output signals, respectively. The first through fourth durations are non-overlapping durations. The first conversion circuit is coupled with the first and second DACs, and configured to receive the first and second analog output signals and generate first and second digital signals during fifth and sixth durations of the clock signal, respectively. The fifth and sixth durations are non-overlapping durations. The second conversion circuit is coupled with the third and fourth DACs, and configured to receive the third and fourth analog output signals and generate third and fourth digital signals during seventh and eighth durations of the clock signal, respectively. The seventh and eighth durations are non-overlapping durations. The seventh and eighth durations partially overlap with at least one of the fifth and sixth durations. The first amplifier is coupled with the first and second DACs, and configured to receive the first and second analog output signals and amplify at least one of the first and second analog output signals to generate a first amplified analog signal during ninth and tenth durations of the clock signal, respectively. The ninth and tenth durations are non-overlapping durations. The second amplifier is coupled with the third and fourth DACs, and configured to receive the third and fourth analog output signals and amplify at least one of the third and fourth analog output signals to generate a second amplified analog signal during eleventh and twelfth durations of the clock signal, respectively. The eleventh and twelfth durations are non-overlapping durations. The eleventh and twelfth durations partially overlap with at least one of the ninth and tenth durations. The second ADC is coupled with the amplifier, and configured to receive at least one of the first and second amplified analog signals and generate a fifth digital signal based on at least one of the first and second amplified analog signals.

In some examples, the first conversion circuit comprises a first comparator and a first successive approximation register (SAR) logic circuit. The first comparator is coupled with the first and second DACs, and configured to receive the first and second analog output signals and generate a first comparison signal based on at least one of the first and second analog output signals. The first SAR logic circuit is coupled with the first comparator, and configured to receive the first comparison signal and generate the first and second digital signals during the fourth and fifth durations, respectively. The first SAR logic circuit is further coupled with the first and second DACs, and further configured to generate and provide a first feedback signal to the first and second DACs. The first feedback signal controls the first and second DACs to generate the first and second analog output signals, respectively.

In some examples, the second conversion circuit comprises a second comparator and a second SAR logic circuit. The second comparator is coupled with the third DAC, and configured to receive the third analog output signal and generate a second comparison signal based on the third analog output signal. The second SAR logic circuit is coupled with the second comparator, and configured to receive the second comparison signal and generate the third digital signal during the sixth duration. The second SAR logic circuit is further coupled with the third DAC, and further configured to generate and provide a second feedback signal to the third DAC. The second feedback signal controls the third DAC to generate the third analog output signal.

In some examples, the amplifier amplifies at least one of the first and second analog output signals after the first conversion circuit generates at least one of the first and second digital signals, respectively, and the third analog output signal after the second conversion circuit generates the third digital signal.

In some examples, the pipeline ADC further comprises an error corrector circuit that is coupled with the second ADC and the first and second conversion circuits. The pipeline ADC is configured to receive the fourth digital signal and at least one of the first through third digital signals, and generate a digital output signal based on the fourth digital signal and at least one of the first through third digital signals. The first through fourth digital signals include first through fourth sets of bits, respectively. Most significant bits (MSBs) of the digital output signal correspond to at least one of the first through third sets of bits, and least significant bits (LSBs) of the digital output signal correspond to the fourth set of bits.

In some examples, the first hybrid MDAC further comprises a selector circuit that is coupled with the first and second conversion circuits and the error corrector circuit. The first hybrid MDAC is configured to receive the first through third digital signals and a select signal, and select and provide one of the first through third digital signals to the error corrector circuit based on the select signal.

In some examples, the first hybrid MDAC further comprises first through third switches that are coupled with the first through third DACs, respectively. The first through third switches are configured to receive the analog input signal and provide the analog input signal to the first through third DACs during the first through third durations, respectively.

In some examples, the first hybrid MDAC further comprises fourth through sixth switches. The fourth and fifth switches are coupled with the first and second DACs, respectively, and configured to receive the first and second analog output signals, respectively. The fourth and fifth switches are further coupled with the first conversion circuit and the amplifier, and further configured to provide, during the fourth and fifth durations, the first and second analog output signals, respectively, to the first conversion circuit and the amplifier. The sixth switch is coupled with the third DAC, and configured to receive the third analog output signal. The sixth switch is further coupled with the second conversion circuit and the amplifier, and further configured to provide, during the sixth duration, the third analog output signal to the second conversion circuit and the amplifier.

Various embodiments of the present disclosure disclose a pipeline ADC. The pipeline ADC comprises a first hybrid MDAC and a second ADC. The first hybrid MDAC comprises multiple DACs, at least one conversion circuit, and at least one amplifier such that a number of conversion circuits and a number of amplifiers is less than a number of DACs. The first hybrid MDAC is configured to receive and sample an analog input signal in corresponding non-overlapping durations of a clock signal. Based on the sampled analog input signal, the DACs are configured to generate multiple analog signals. At least one conversion circuit is coupled with more than one DAC, and configured to receive the analog output signals and perform conversion operation to generate corresponding digital signals in non-overlapping durations of the clock signal, respectively. The durations for performing the conversion operation of at least two conversion circuits overlap partially. At least one amplifier is coupled with more than one DAC, and configured to receive the analog output signals and perform amplification operation to generate corresponding amplified analog signals in non-overlapping durations of the clock signal, respectively. The durations for performing the amplification operation of at least two amplifiers overlap partially.

The pipeline ADC utilizes at least one full cycle of the input clock signal to perform conversion and amplification operations as compared to half cycle of an input clock signal that are utilized for performing conversion and amplification operations by the conventional pipeline ADCs. As need for implementing high powered components (that perform the aforementioned operations in half cycle of the clock signal) in the pipeline ADC is eliminated, the pipeline ADC consumes low power, has low cost, and operates at a higher speed as compared to conventional pipeline ADCs that implement high-powered components. Further, a number of conversion circuits and amplifiers required by the pipeline ADC is less as compared to conventional pipeline ADCs. As a result, a size of the pipeline ADC is less, and hence an area occupied by the pipeline ADC on a system-on-chip (SoC) is less as compared to the area occupied by conventional pipeline ADCs.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
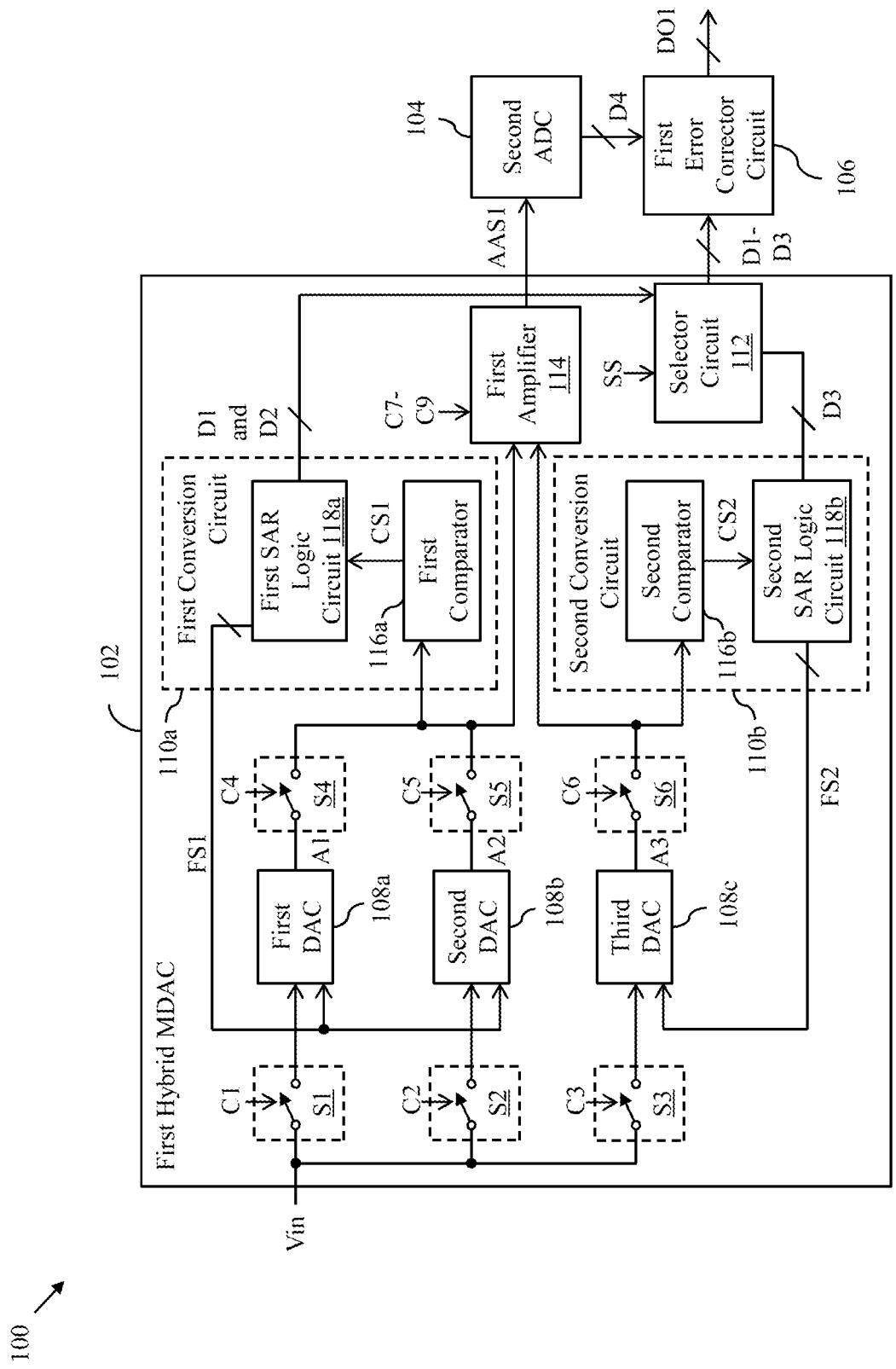
FIG. 1 is a block diagram of a first pipeline analog-to-digital converter (ADC) in accordance with an embodiment of the present disclosure.

FIG. 1 is a block diagram of a first pipeline analog-to-digital converter (ADC) 100 in accordance with an embodiment of the present disclosure. The first pipeline ADC 100 is configured to receive an analog input signal Vin from a first functional circuit (not shown). The first functional circuit may be any analog circuit (e.g., an analog sensor circuit) that is configured to generate the analog input signal Vin. The analog input signal Vin is indicative of a test signal, a functional signal, or the like. The first pipeline ADC 100 is further configured to convert the analog input signal Vin to generate a first digital output signal DO1. The first pipeline ADC 100 may be further configured to provide the first digital output signal DO1 to a second functional circuit (not shown). The second functional circuit may be any digital circuit that is configured to receive the first digital output signal DO1 and perform operations related to display, testing, or the like. In one embodiment, the first and second functional circuits and the first pipeline ADC 100 are included on a system-on-chip (SoC) (not shown).

The first pipeline ADC 100 is a hybrid pipeline ADC that includes multiple ADC stages such as a first hybrid multiplying digital-to-analog converter (MDAC) 102, a second ADC 104, and a first error corrector circuit 106. The first hybrid MDAC 102 and the second ADC 104 are arranged in a pipeline architecture. The first pipeline ADC 100 may further include a first clock generator circuit (not shown). In one embodiment, the first clock generator circuit is internal to the first hybrid MDAC 102. In another embodiment, the first clock generator circuit is external to the first hybrid MDAC 102.

The first clock generator circuit is configured to generate an input clock signal (shown later in FIGS. 2, 4, 6, 8, and 10). In the presently preferred embodiment, the first clock generator circuit is further configured to generate first through ninth clock signals C1-C9. In one example, the first through ninth clock signals C1-C9 are derived from the input clock signal by altering time durations of the input clock signal differently such that the second through ninth clock signals C2-C9 may be delayed versions of the first clock signal C1. A duration for which the first through ninth clock signals C1-C9 remain at logic high state is less than a duration for which the first through ninth clock signals C1-C9 remain at logic low state.

The first through ninth clock signals C1-C9 remain at logic high state for first through ninth durations of the input clock signal, respectively. Each of the first through third durations corresponds to at most one cycle of the input clock signal whereas each of the fourth through sixth durations corresponds to at least half cycle of the input clock signal. Further, each of the seventh through ninth durations corresponds to at least one cycle of the input clock signal. It will be apparent to a person skilled in the art that although in the current embodiment, the first clock generator circuit generates the first through ninth clock signals C1-C9, the scope of the present disclosure is not limited to it. In various other embodiments, the first pipeline ADC 100 may include second through tenth clock generator circuits (not shown) that are configured to receive the input clock signal and generate the first through ninth clock signals C1-C9, respectively, without deviating from the scope of the present disclosure. It will further be apparent to those of skill in the art that although in the current embodiment, the first through ninth clock signals C1-C9 remain at logic high state for the first through ninth durations, respectively, in an alternate embodiment, the first through ninth clock signals C1-C9 remain at logic low state for the first through ninth durations, respectively.

The first hybrid MDAC 102 includes first through third switches S1-S3, first through third digital-to-analog converters (DACs) 108a-108c, fourth through sixth switches S4-S6, first and second conversion circuits 110a and 110b, a selector circuit 112, and a first amplifier 114. The first through third switches S1-S3 are coupled with the first functional circuit, and configured to receive the analog input signal Vin and the first through third clock signals C1-C3, respectively. The first through third switches S1-S3 are activated during the first through third durations of the input clock signal, i.e., when the first through third clock signals C1-C3 are at logic high state, respectively.

It will be apparent to those of skill in the art that although in the current embodiment, the first through third switches S1-S3 are activated when the first through third clock signals C1-C3 are at logic high state, respectively, the scope of the present disclosure is not limited to it. In various other embodiments, the first through third switches S1-S3 are activated when the first through third clock signals C1-C3 are at logic low state, respectively, without deviating from the scope of the present disclosure. In one example, each of the first through third switches S1-S3 is a p-channel metal oxide semiconductor transistor. In another example, each of the first through third switches S1-S3 is a n-channel metal oxide semiconductor transistor.

The first through third switches S1-S3 are configured to receive and sample the analog input signal Vin when the first through third switches S1-S3 are activated, respectively. Further, the first through third switches S1-S3 are coupled with the first through third DACs 108a-108c, respectively, and configured to provide the sampled analog input signal Vin to the first through third DACs 108a-108c during the first through third durations, respectively. In the presently preferred embodiment, though the first through third switches S1-S3 are internal to the first hybrid MDAC 102 and external to the first through third DACs 108a-108c, in another embodiment, the first through third switches S1-S3 are external to the first hybrid MDAC 102. In yet another embodiment, the first through third switches S1-S3 are internal to the first through third DACs 108a-108c, respectively.

The first through third DACs 108a-108c are implemented in a pipelined and a partial time-interleaved architecture. The first through third DACs 108a-108c are configured to receive, by way of the first through third switches S1-S3, the sampled analog input signal Vin during the first through third durations of the input clock signal, i.e., when the first through third switches S1-S3 are activated, respectively. Further, the first through third DACs 108a-108c are configured to generate first through third analog output signals A1-A3 on receiving the sampled analog input signal Vin, respectively. In the presently preferred embodiment, the first through third DACs 108a-108c are capacitive DACs that include first through third sets of capacitors (not shown), respectively. Each of the first and second DACs 108a and 108b is further configured to receive a first feedback signal FS1. The first feedback signal FS1 controls charging and discharging of the first and second sets of capacitors, i.e., controls the first and second DACs 108a and 108b, to generate the first and second analog output signals A1 and A2, respectively. The third DAC 108c is further configured to receive a second feedback signal FS2. The second feedback signal FS2 controls charging and discharging of the third set of capacitors, i.e., controls the third DAC 108c, to generate the third analog output signal A3. It will be apparent to those of skill in the art that although in the current embodiment, the first hybrid MDAC 102 includes the first through third DACs 108a-108c, in alternate embodiments, the first hybrid MDAC 102 may include more than three DACs without deviating from the scope of the present disclosure.

The fourth through sixth switches S4-S6 are coupled with the first through third DACs 108a-108c, respectively, and configured to receive the first through third analog output signals A1-A3 and the fourth through sixth clock signals C4-C6, respectively. The fourth through sixth switches S4-S6 are activated during the fourth through sixth durations of the input clock signal, i.e., when the fourth through sixth clock signals C4-C6 are at logic high state, respectively. The fourth switch S4 receives and outputs the first analog output signal A1 when the fourth switch S4 is activated. Similarly, the fifth and sixth switches S5 and S6 receive and output the second and third analog output signals A2 and A3 when the fifth and sixth switches S5 and S6 are activated, respectively. The fourth and fifth switches S4 and S5 are further coupled with the first conversion circuit 110a and the first amplifier 114, and further configured to provide the first and second analog output signals A1 and A2, respectively, to the first conversion circuit 110a and the first amplifier 114. The sixth switch S6 is further coupled with the second conversion circuit 110b and the first amplifier 114, and further configured to provide the third analog output signal A3 to the second conversion circuit 110b and the first amplifier 114.

It will be apparent to those of skill in the art that although in the current embodiment, the fourth through sixth switches S4-S6 are activated when the fourth through sixth clock signals C4-C6 are at logic high state, respectively, the scope of the present disclosure is not limited to it. In various other embodiments, the fourth through sixth switches S4-S6 are activated when the fourth through sixth clock signals C4-C6 are at logic low state, respectively, without deviating from the scope of the present disclosure. In one example, each of the fourth through sixth switches S4-S6 is a p-channel metal oxide semiconductor transistor. In another example, each of the fourth through sixth switches S4-S6 is a n-channel metal oxide semiconductor transistor.

The first conversion circuit 110a is coupled with the first and second DACs 108a and 108b by way of the fourth and fifth switches S4 and S5, respectively, and configured to receive the first and second analog output signals A1 and A2. The first conversion circuit 110a is further configured to convert the first and second analog output signals A1 and A2 to generate first and second digital signals D1 and D2 during the fourth and fifth durations, respectively. Further, the first conversion circuit 110a is configured to generate and provide the first feedback signal FS1 to the first and second DACs 108a and 108b to control the first and second DACs 108a and 108b, respectively. In an embodiment, the first feedback signal FS1 is generated based on the first and second analog output signals A1 and A2.

The first conversion circuit 110a includes a first comparator 116a and a first successive approximation register (SAR) logic circuit 118a. The first comparator 116a is coupled with the fourth and fifth switches S4 and S5. Thus, the first comparator 116a is coupled with the first and second DACs 108a and 108b by way of the fourth and fifth switches S4 and S5, respectively, and configured to receive the first and second analog output signals A1 and A2. The first comparator 116a is further configured to generate a first comparison signal CS1 based on at least one of the first and second analog output signals A1 and A2.

To generate the first comparison signal CS1, the first comparator 116a is further configured to receive and compare at least one of the first and second analog output signals A1 and A2 with a first reference signal (not shown) when one of the fourth and fifth switches S4 and S5 is activated, respectively. The first reference signal is generated by a reference signal generator (not shown). In one embodiment, the reference signal generator corresponds to a bandgap circuit. Further, a voltage level of the first reference signal is equal to a common mode voltage level of the analog input signal yin when the first through third DACs 108a-108c are top-plate sampling DACs. Alternatively, when the first through third DACs 108a-108c are bottom-plate sampling DACs, the first reference signal is at a voltage level that is half of a supply voltage (not shown). The first comparator 116a compares one of the first and second analog output signals A1 and A2 with the first reference signal at each cycle of a first comparison clock signal (not shown). In one example, when the fourth switch S4 is activated, the first comparator 116a compares the first analog output signal A1 with the first reference signal to generate the first comparison signal CSI. The number of cycles for comparison are based on the number of bits of one of the first and second digital signals D1 and D2. In one example, the first comparator 116a performs the comparison for M-cycles of the first comparison clock signal when the corresponding digital signal includes M-bits. In one embodiment, the first comparison clock signal is generated by the first clock generator circuit.

The first SAR logic circuit 118a is coupled with the first comparator 116a, and configured to receive the first comparison signal CS1. The first comparator 116a and the first SAR logic circuit 118a successively approximate the first and second analog output signals A1 and A2 to generate the first and second digital signals D1 and D2, respectively. The first SAR logic circuit 118a is further configured to generate the first feedback signal FS1 at each cycle of the first comparison clock signal. The first SAR logic circuit 118a is further coupled with the first and second DACs 108a and 108b, and configured to provide the first feedback signal FS1 to the first and second DACs 108a and 108b. After each cycle of the first comparison clock signal, the first SAR logic circuit 118a generates a corresponding bit of one of the first and second digital signals D1 and D2. Thus, after M-cycles of the first comparison clock signal, the first SAR logic circuit 118a completes generation of the M-bits of one of the first and second digital signals D1 and D2. The first SAR logic circuit 118a generates the first and second digital signals D1 and D2 during the fourth and fifth durations of the input clock signal, respectively.

The second conversion circuit 110b is coupled with the third DAC 108c by way of the sixth switch S6, and configured to receive the third analog output signal A3. The second conversion circuit 110b is further configured to convert the third analog output signal A3 to generate a third digital signal D3 during the sixth duration. Further, the second conversion circuit 110b is configured to generate and provide the second feedback signal FS2 to the third DAC 108c to control the third DAC 108c. In an embodiment, the second feedback signal FS2 is generated based on the third analog output signal A3.

The second conversion circuit 110b includes a second comparator 116b and a second SAR logic circuit 118b. The second comparator 116b is coupled with the sixth switch S6. Thus, the second comparator 116b is coupled with the third DAC 108c by way of the sixth switch S6, and configured to receive the third analog output signal A3. The second comparator 116b is further configured to generate a second comparison signal CS2 based on the third analog output signal A3.

To generate the second comparison signal CS2, the second comparator 116b is further configured to receive and compare the third analog output signal A3 with the first reference signal when the sixth switch S6 is activated. The second comparator 116b compares the third analog output signal A3 with the first reference signal at each cycle of a second comparison clock signal (not shown). The number of cycles for comparison are based on the number of bits of the third digital signal D3. In one example, the second comparator 116b performs the comparison for M-cycles of the second comparison clock signal when the corresponding digital signal includes M-bits. In one embodiment, the second comparison clock signal is generated by the first clock generator circuit.

The second SAR logic circuit 118b is coupled with the second comparator 116b, and configured to receive the second comparison signal CS2. The second comparator 116b and the second SAR logic circuit 118b successively approximate the third analog output signal A3 to generate the third digital signal D3. The second SAR logic circuit 118b is further configured to generate the second feedback signal FS2 at each cycle of the second comparison clock signal. The second SAR logic circuit 118b is further coupled with the third DAC 108c, and configured to provide the second feedback signal FS2 to the third DAC 108c. After each cycle of the second comparison clock signal, the second SAR logic circuit 118b generates a corresponding bit of the third digital signal D3. Thus, after M-cycles of the second comparison clock signal, the second SAR logic circuit 118b completes generation of the M-bits of the third digital signal D3. The second SAR logic circuit 118b generates the third digital signal D3 during the sixth duration of the input clock signal. The first through third digital signals D1-D3 include first through third sets of bits such that most significant bits (MSBs) of the first digital output signal DO1 correspond to at least one of the first through third sets of bits, respectively. In one example, each of the first through third sets of bits includes N-bits.

The selector circuit 112 is coupled with the first and second SAR logic circuits 118a and 118b, and configured to receive the first through third digital signals D1-D3 and a select signal SS. The selector circuit 112 is further coupled with the first error corrector circuit 106, and further configured to select and provide one of the first through third digital signals D1-D3 to the first error corrector circuit 106 based on the select signal SS. The select signal SS may be generated by the first clock generator circuit based on the fourth through sixth clock signals C4-C6. When the fourth clock signal C4 is at logic high state, the select signal SS indicates the selector circuit 112 to select and provide the first digital signal D1 to the first error corrector circuit 106. Similarly, when the fifth and sixth clock signals C5 and C6 are at logic high state, the select signal SS indicates the selector circuit 112 to select and provide the second and third digital signals D2 and D3 to the first error corrector circuit 106, respectively. In one example, the selector circuit 112 is implemented by way of a multiplexer.

The first amplifier 114 is coupled with the first through third DACs 108a-108c by way of the fourth through sixth switches S4-S6, respectively, and configured to receive the first through third analog output signals A1-A3. The first amplifier 114 is further configured to receive the seventh through ninth clock signals C7-C9. The seventh through ninth clock signals C7-C9 control an amplification operation of the first amplifier 114. The first amplifier 114 is further configured to amplify at least one of the first through third analog output signals A1-A3 to generate a first amplified analog signal AAS1 during the seventh through ninth durations of the input clock signal, i.e., when the seventh through ninth clock signals C7-C9 are at logic high states, respectively. The first amplifier 114 amplifies at least one of the first and second analog output signals A1 and A2 after the first conversion circuit 110a generates at least one of the first and second digital signals D1 and D2, respectively, and the third analog output signal A3 after the second conversion circuit 110b generates the third digital signal D3.

The second ADC 104 is coupled with the first amplifier 114, and configured to receive the first amplified analog signal AAS1. The second ADC 104 is configured to generate a fourth digital signal D4 by converting the first amplified analog signal AAS1. In one embodiment, the second ADC 104 is structurally and functionally similar to the first hybrid MDAC 102. In another embodiment, the second ADC 104 is a sub-ranging SAR ADC (not shown). The fourth digital signal D4 includes a fourth set of bits such that least significant bits (LSBs) of the first digital output signal DO1 correspond to the fourth set of bits. In one example, the fourth set of bits includes N-bits.

The first error corrector circuit 106 is coupled with the first and second SAR logic circuits 118a and 118b by way of the selector circuit 112, and configured to receive one of the first through third digital signals D1-D3. The first error corrector circuit 106 is further coupled with the second ADC 104, and configured to receive the fourth digital signal D4. In one example, the first error corrector circuit 106 receives the first and fourth digital signals D1 and D4. The first error corrector circuit 106 is further configured to compare the LSB of the first digital signal D1 with the MSB of the fourth digital signal D4 to determine whether the LSB of the first digital signal D1 matches the MSB of the fourth digital signal D4. Based on the determination, the first error corrector circuit 106 is further configured to determine whether the first and fourth digital signals D1 and D4 are error-free or erroneous. The first and fourth digital signals D1 and D4 are error-free when the LSB of the first digital signal D1 matches the MSB of the fourth digital signal D4. The first and fourth digital signals D1 and D4 are erroneous when the LSB of the first digital signal D1 does not match with the MSB of the fourth digital signal D4. The first error corrector circuit 106 is further configured to correct the errors in each of the first and fourth digital signals D1 and D4 when the first and fourth digital signals D1 and D4 are erroneous, respectively. The first error corrector circuit 106 is further configured to generate and output the first digital output signal DO1 based on the first and fourth digital signals D1 and D4 when the first and fourth digital signals D1 and D4 are error-free. It will be apparent to a person skilled in the art that the number of bits of the first digital output signal DO1 are based on the number of bits of the first and fourth digital signals D1 and D4. In an example, when the first digital signal D1 is of M-bits and the fourth digital signal D4 is of N-bits, the first digital output signal DO1 is of (M+N− 1) bits. It will be apparent to those of skill in the art that when the first error corrector circuit 106 receives one of the second and third digital signals D2 and D3, the first error corrector circuit 106 generates the first digital output signal DO1 based on one of the second and third digital signals D2 and D3 in a manner similar to the generation of the first digital output signal DO1 based on the first digital signal D1.

Figure 2:
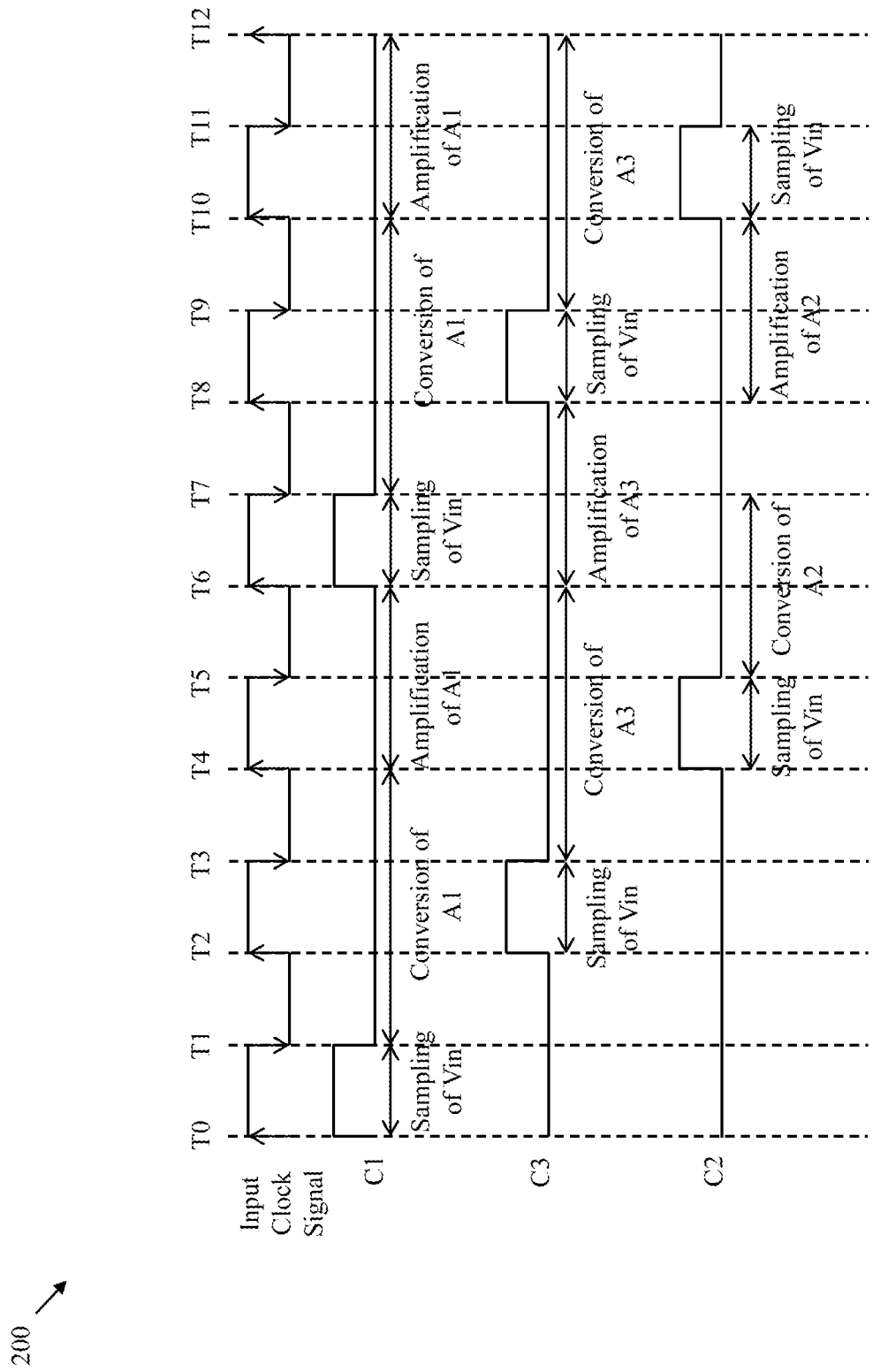
FIG. 2 is a timing diagram that illustrates an operation of the first pipeline ADC of FIG. 1 in accordance with an embodiment of the present disclosure.

FIG. 2 is a timing diagram 200 illustrating an operation of the first pipeline ADC 100 in accordance with an embodiment of the present disclosure. In the embodiment, the first through third durations are non-overlapping durations, i.e., the first through third durations do not overlap with each other. Further, the fourth and fifth durations are non-overlapping durations. Furthermore, the sixth duration partially overlaps with at least one of the fourth and fifth durations, i.e., the sixth duration partially overlaps with the fourth and fifth durations one at a time. The sixth duration and one of the fourth and fifth durations remain at the same logic state (such as logic high state) simultaneously when the sixth duration partially overlaps with one of the fourth and fifth durations, respectively. In the current embodiment, the sixth duration and one of the fourth and fifth durations partially overlap for half cycle of the input clock signal. The seventh through ninth durations are non-overlapping durations. Each of the first through third durations corresponds to a half cycle of the input clock signal, and each of the fourth and sixth durations corresponds to one and a half cycle of the input clock signal. The fifth duration corresponds to one cycle of the input clock signal. Further, each of the seventh through ninth durations corresponds to one cycle of the input clock signal.

At time instance T0, the first clock signal C1 transitions from logic low state to logic high state and the second and third clock signals C2 and C3 are at logic low state. During time period T0-T1 (i.e., during the first duration), the first clock signal C1 remains at logic high state, and the second and third clock signals C2 and C3 remain at logic low state. The first switch S1 is thus activated and the second and third switches S2 and S3 remain deactivated. The first switch S1 performs sampling of the analog input signal Vin. Further, the first DAC 108a receives the analog input signal Vin and generates the first analog output signal A1.

At time instance T1, the first clock signal C1 transitions from logic high state to logic low state, thereby deactivating the first switch S1. During time period T1-T2, the first through third clock signals C1-C3 remain at logic low state and the first through third switches S1-S3 remain deactivated.

At time instance T2, the third clock signal C3 transitions from logic low state to logic high state, thereby activating the third switch S3. During time period T2-T3 (i.e., during the third duration), the third clock signal C3 remains at logic high state, and the first and second clock signals C1 and C2 remain at logic low state. Thus, the third switch S3 remains activated, and the first and second switches S1 and S2 remain deactivated. The third switch S3 performs sampling of the analog input signal Vin. Further, the third DAC 108c receives the sampled analog input signal Vin and generates the third analog output signal A3.

At time instance T3, the third clock signal C3 transitions from logic high state to logic low state, thereby deactivating the third switch S3. During time period T3-T4, the first through third clock signals C1-C3 remain at logic low state and the first through third switches S1-S3 remain deactivated. During time period T1-T4 (i.e., during the fourth duration), the first conversion circuit 110a performs conversion of the first analog output signal A1 to generate the first digital signal D1.

At time instance T4, the second clock signal C2 transitions from logic low state to logic high state, thereby activating the second switch S2. During time period T4-T5 (i.e., during the second duration), the second clock signal C2 remains at logic high state, and the first and third clock signals C1 and C3 remain at logic low state. Thus, the second switch S2 remains activated, and the first and third switches S1 and S3 remain deactivated. The second switch S2 performs sampling of the analog input signal Vin. Further, the second DAC 108b receives the sampled analog input signal Vin and generates the second analog output signal A2.

At time instance T5, the second clock signal C2 transitions from logic high state to logic low state, thereby deactivating the second switch S2. During time period T5-T6, the first through third clock signals C1-C3 remain at logic low state and the first through third switches S1-S3 remain deactivated. During time period T3-T6 (i.e., during the sixth duration), the second conversion circuit 110b performs conversion of the third analog output signal A3 to generate the third digital signal D3. During time period 13-T4, as the fourth duration partially overlaps with the sixth duration for half cycle of the input clock signal, the first and second conversion circuits 110a and 110b simultaneously perform conversion of the first and third analog output signals A1 and A3, respectively. Further, during time period T4-T6 (i.e., during the seventh duration), the first amplifier 114 performs amplification of the first analog output signal A1.

At time instance T6, the first clock signal C1 transitions from logic low state to logic high state, thereby activating the first switch S1. During time period T6-T7, the first clock signal C1 remains at logic high state, and the second and third clock signals C2 and C3 remain at logic low state. The first switch S1 is thus activated and the second and third switches S2 and S3 remain deactivated. The first switch S1 performs sampling of the analog input signal Vin. Further, the first DAC 108a receives the analog input signal Vin and generates the first analog output signal A1. During time period T5-T7 (i.e., during the fifth duration), the first conversion circuit 110a performs conversion of the second analog output signal A2 to generate the second digital signal D2. During time period T5-T6, as the fifth duration partially overlaps with the sixth duration for half cycle of the input clock signal, the first and second conversion circuits 110a and 110b simultaneously perform conversion of the second and third analog output signals A2 and A3, respectively.

At time instance T7, the first clock signal C1 transitions from logic high state to logic low state, thereby deactivating the first switch S1. During time period T7-T8, the first through third clock signals C1-C3 remain at logic low state and the first through third switches S1-S3 remain deactivated. During time period T6-T8 (i.e., during the ninth duration), the first amplifier 114 performs amplification of the third analog output signal A3. Further, during time period T7-T12, the conversion of the first analog output signal A1 and the amplification of the first analog output signal A1 occur in a similar manner as performed during time period T1-T6.

During time period T8-T10 (i.e., during the eighth duration), the first amplifier 114 performs amplification of the second analog output signal A2. During time period T8-T12, the sampling of the analog input signal Vin and the conversion of the third analog output signal A3 occur in a similar manner as performed during time period 12-T6. Further, during time period T10-T11, the sampling of the analog input signal Vin occurs in a similar manner as performed during time period T4-T5.

Figure 3:
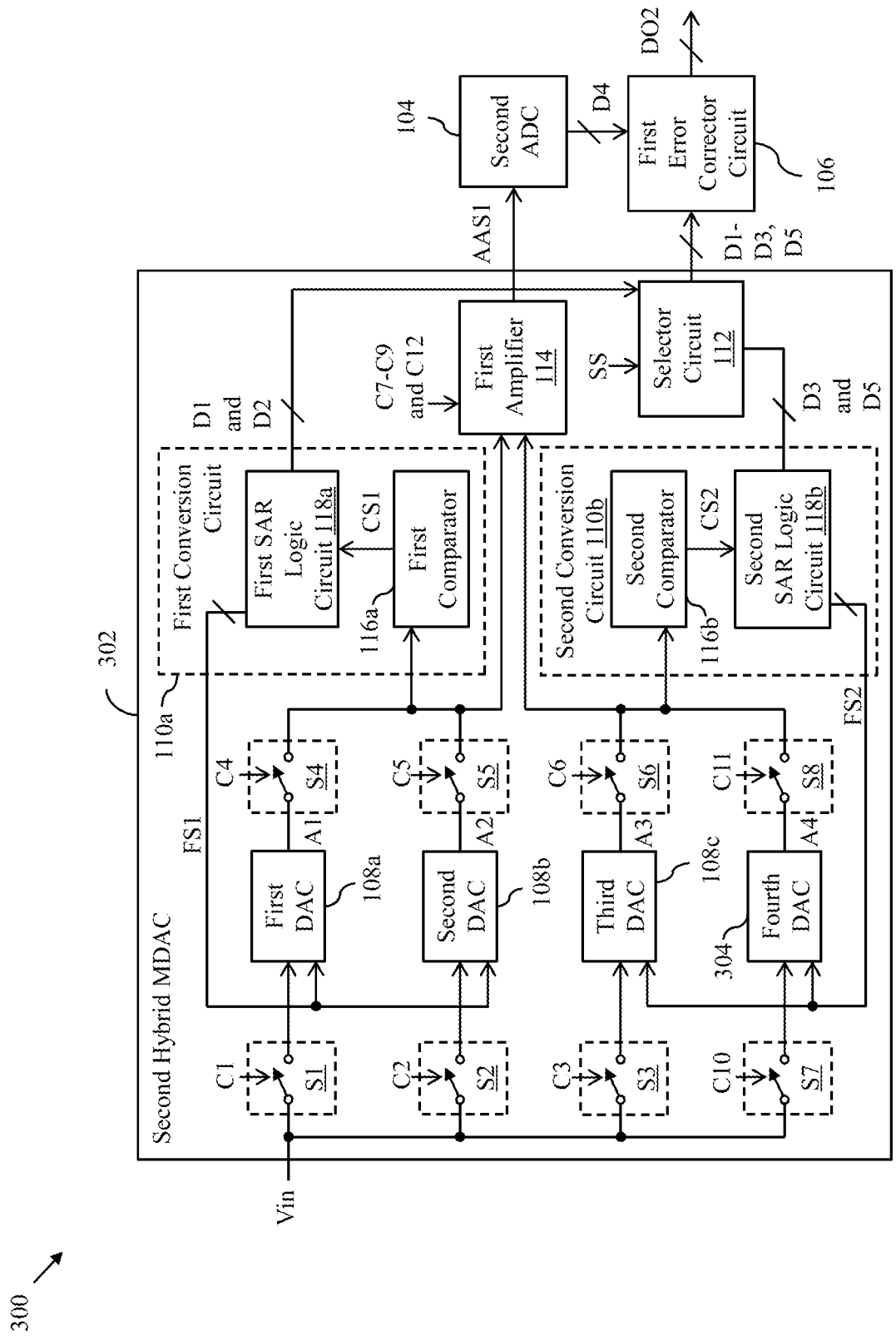
FIG. 3 is a block diagram of a second pipeline ADC in accordance with another embodiment of the present disclosure.

FIG. 3 is a block diagram of a second pipeline ADC 300 in accordance with another embodiment of the present disclosure. The second pipeline ADC 300 is configured to receive the analog input signal Vin from the first functional circuit. The second pipeline ADC 300 is further configured to convert the analog input signal Vin to generate a second digital output signal DO2. The second pipeline ADC 300 may be further configured to provide the second digital output signal DO2 to the second functional circuit.

The second pipeline ADC 300 is a hybrid pipeline ADC that includes a second hybrid MDAC 302, the second ADC 104, and the first error corrector circuit 106. The second pipeline ADC 300 may further include the first clock generator circuit. In the presently preferred embodiment, the first clock generator circuit is further configured to generate tenth through twelfth clock signals C10-C12 in a manner similar to the generation of the first through ninth clock signals C1-C9. The tenth through twelfth clock signals C10-C12 remain at logic high state for tenth through twelfth durations of the input clock signal, respectively. The tenth duration corresponds to at most one cycle of the input clock signal, the eleventh duration corresponds to at least half cycle of the input clock signal, and the twelfth duration corresponds to at least one cycle of the input clock signal.

The second hybrid MDAC 302 is coupled with the first functional circuit, and configured to receive the analog input signal Vin. Based on the analog input signal yin, the second hybrid MDAC 302 is configured to generate the first through third digital signals D1-D3 and a fifth digital signal D5 during the fourth through sixth durations and the eleventh duration of the input clock signal, respectively. The second hybrid MDAC 302 is further configured to generate the first amplified analog signal AAS1. The fifth digital signal D5 includes a fifth set of bits such that MSBs of the second digital output signal DO2 correspond to at least one of the first through third sets of bits and the fifth set of bits. In one example, the fifth set of bits includes M-bits. The second hybrid MDAC 302 includes the first through sixth switches S1-S6, the first through third DACs 108a-108c, seventh and eighth switches S7 and S8, a fourth DAC 304, the first and second conversion circuits 110a and 110b, the selector circuit 112, and the first amplifier 114. The first through sixth switches S1-S6 and the first through third DACs 108a-108c function in a similar manner as described in FIG. 1. The seventh and eighth switches S7 and S8 receive the tenth and eleventh clock signals C10 and C11, respectively. The seventh switch S7 is structurally and functionally similar to the first switch S1 whereas the eighth switch S8 is structurally and functionally similar to the fourth switch S4. The fourth DAC 304 is structurally and functionally similar to the first DAC 108a.

The seventh switch S7 is coupled with the first functional circuit, and configured to receive the analog input signal Vin. The seventh switch S7 is activated during the tenth duration of the input clock signal. The seventh switch S7 receives and samples the analog input signal Vin when the seventh switch S7 is activated. The seventh switch S7 is further coupled with the fourth DAC 304, and further configured to provide the sampled analog input signal Vin to the fourth DAC 304.

The fourth DAC 304 is coupled with the seventh switch S7, and configured to receive the sampled analog input signal Vin during the seventh duration of the input clock signal, i.e., when the seventh switch S7 is activated. Further, the fourth DAC 304 is configured to generate a fourth analog output signal A4 on receiving the sampled analog input signal Vin. The fourth DAC 304 is further configured to receive the second feedback signal FS2. The second feedback signal FS2 controls the fourth DAC 304 to generate the fourth analog output signal A4.

The eighth switch S8 is coupled with the fourth DAC 304, and configured to receive the fourth analog output signal A4. The eighth switch S8 is activated during the eleventh duration of the input clock signal. The eighth switch S8 receives and outputs the fourth analog output signal A4 when the eighth switch S8 is activated. The eighth switch S8 is further coupled with the second conversion circuit 110b and the first amplifier 114, and further configured to provide the fourth analog output signal A4 to the second conversion circuit 110b and the first amplifier 114.

The first conversion circuit 110a functions in a similar manner as described in FIG. 1. The second conversion circuit 110b is coupled with the third DAC 108c and the fourth DAC 304 by way of the sixth switch S6 and the eighth switch S8, respectively, and configured to receive at least one of the third and fourth analog output signals A3 and A4. The second conversion circuit 110b converts at least one of the third and fourth analog output signals A3 and A4 to generate at least one of the third and fifth digital signals D3 and D5 in the sixth and eleventh durations, respectively. Further, the second conversion circuit 110b generates and provides the second feedback signal FS2 to the third DAC 108c and the fourth DAC 304 to control the third DAC 108c and the fourth DAC 304, respectively.

The second conversion circuit 110b includes the second comparator 116b and the second SAR logic circuit 118b. The second comparator 116b is coupled with the sixth and eighth switches S6 and S8. Thus, the second comparator 116b is coupled with the third DAC 108c and the fourth DAC 304 by way of the sixth and eighth switches S6 and S8, respectively, and configured to receive the third and fourth analog output signals A3 and A4. The second comparator 116b is further configured to generate the second comparison signal CS2 based on at least one of the third and fourth analog output signals A3 and A4 in a manner similar to the generation of the first comparison signal CS1 by the first comparator 116a.

The second SAR logic circuit 118b is coupled with the second comparator 116b, the third DAC 108c, and the fourth DAC 304. The second SAR logic circuit 118b is configured to receive the second comparison signal CS2. The second comparator 116*b* and the second SAR logic circuit 118*b* are configured to successively approximate at least one of the third and fourth analog output signals A3 and A4 to generate at least one of the third and fifth digital signals D3 and D5, respectively. The second SAR logic circuit 118*b* is further configured to generate the second feedback signal FS2 at each cycle of the second comparison clock signal, and provide the second feedback signal FS2 to the third DAC 108*c* and the fourth DAC 304. After each cycle of the second comparison clock signal, the second SAR logic circuit 118*b* generates a corresponding bit of at least one of the third and fifth digital signals D3 and D5. The second SAR logic circuit 118*b* generates the third and fifth digital signals D3 and D5 during the sixth and eleventh durations of the input clock signal, i.e., when the sixth and eighth switches S6 and S8 are activated, respectively.

The selector circuit 112 is coupled with the first and second SAR logic circuits 118*a* and 118*b*, and configured to receive the first through third digital signals D1-D3, the fifth digital signal D5, and the select signal SS. The selector circuit 112 is further coupled with the first error corrector circuit 106, and further configured to select and provide one of the first through third digital signals D1-D3 and the fifth digital signal D5 to the first error corrector circuit 106 based on the select signal SS. When the fourth through sixth clock signals C4-C6 are at logic high state, the select signal SS indicates the selector circuit 112 to select and provide the first through third digital signals D1-D3 to the first error corrector circuit 106, respectively. Further, when the eleventh clock signal C11 is at logic high state, the select signal SS indicates the selector circuit 112 to select and provide the fifth digital signal D5 to the first error corrector circuit 106.

The second ADC 104 functions in a similar manner as described in FIG. 1 to generate the fourth digital signal D4. The fourth digital signal D4 includes the fourth set of bits such that LSBs of the second digital output signal DO2 correspond to the fourth set of bits. The first error corrector circuit 106 is coupled with the second ADC 104 and the selector circuit 112, and configured to receive the fourth digital signal D4 and at least one of the first through third digital signals D1-D3 and the fifth digital signal D5. The first error corrector circuit 106 generates the second digital output signal DO2 based on the fourth digital signal D4 and at least one of the first through third digital signals D1-D3 and the fifth digital signal D5 in a manner similar to the generation of the first digital output signal DO1 as described in FIG. 1.

Figure 4:
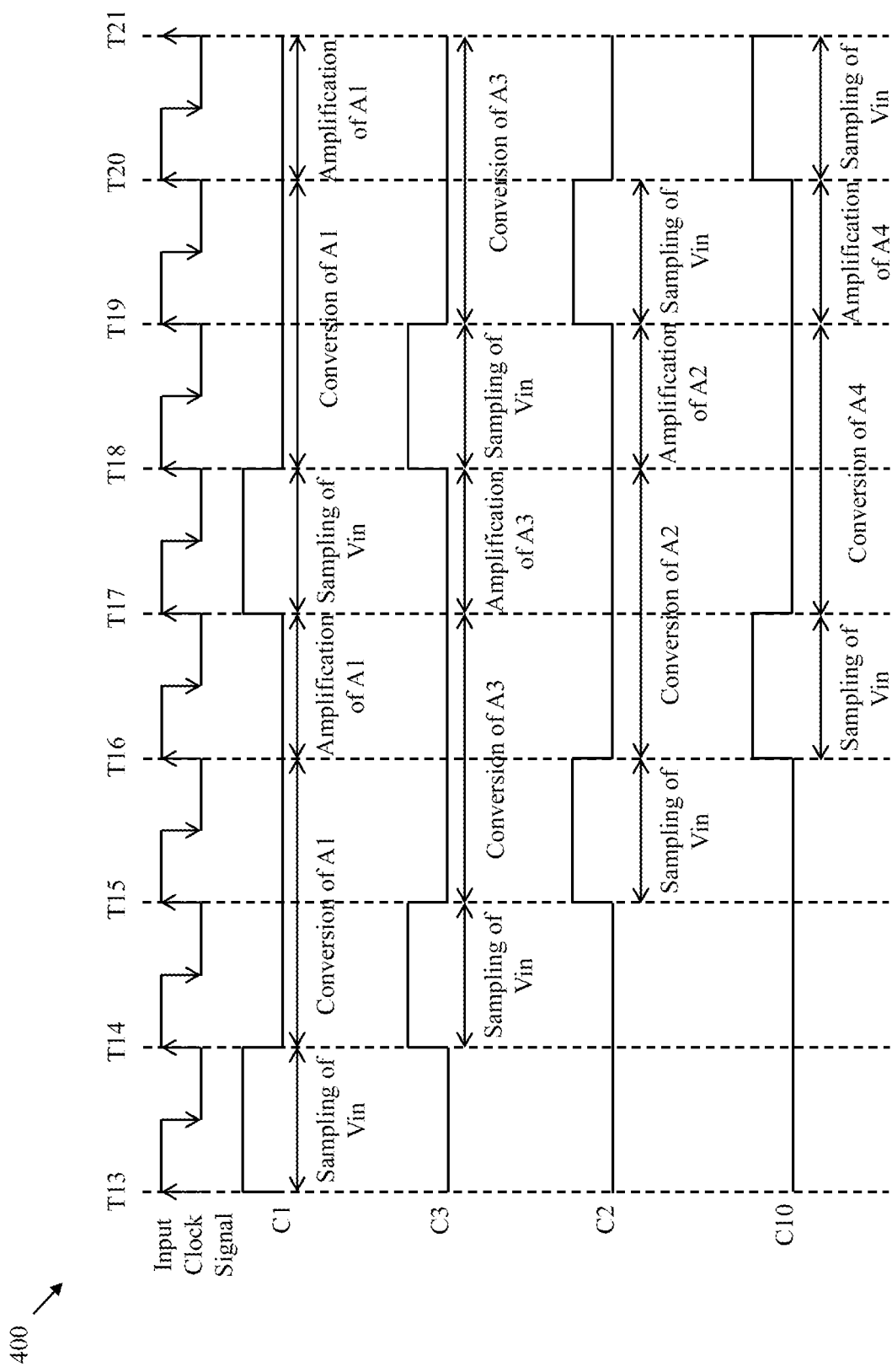
FIG. 4 is a timing diagram that illustrates an operation of the second pipeline ADC of FIG. 3 in accordance with another embodiment of the present disclosure.

FIG. 4 is a timing diagram 400 illustrating an operation of the second pipeline ADC 300 in accordance with another embodiment of the present disclosure. In the embodiment, the first through third durations and the tenth duration are non-overlapping durations. The eleventh duration and the sixth duration are non-overlapping. The eleventh duration partially overlaps with at least one of the fourth and fifth durations. The seventh through ninth durations and the twelfth duration are non-overlapping durations. Each of the first through third durations and the tenth duration corresponds to one cycle of the input clock signal, and each of the fourth through sixth durations and the eleventh duration corresponds to two cycles of the input clock signal. Further, each of the seventh through ninth durations and the twelfth duration corresponds to one cycle of the input clock signal.

At time instance T13, the first clock signal C1 transitions from logic low state to logic high state and the second, third, and tenth clock signals C2, C3, and C10 are at logic low state. During time period T13-T14 (i.e., during the first duration), the first clock signal C1 remains at logic high state, and the second, third, and tenth clock signals C2, C3, and C10 remain at logic low state. The first switch S1 is thus activated and the second, third, and seventh switches S2, S3, and S7 remain deactivated. The first switch S1 performs sampling of the analog input signal Vin. Further, the first DAC 108*a* receives the analog input signal Vin and generates the first analog output signal A1.

At time instance T14, the first clock signal C1 transitions from logic high state to logic low state and the third clock signal C3 transitions from logic low state to logic high state, thereby deactivating the first switch S1 and activating the third switch S3, respectively. During time period T14-T15 (i.e., during the third duration), the third clock signal C3 remains at logic high state, and the first, second, and tenth clock signals C1, C2, and C10 remain at logic low state. Thus, the third switch S3 remains activated, and the first, second, and seventh switches S1, S2, and S7 remain deactivated. The third switch S3 performs sampling of the analog input signal Vin. Further, the third DAC 108*c* receives the sampled analog input signal Vin and generates the third analog output signal A3.

At time instance T15, the third clock signal C3 transitions from logic high state to logic low state and the second clock signal C2 transitions from logic low state to logic high state, thereby deactivating the third switch S3 and activating the second switch S2, respectively. During time period T15-T16 (i.e., during the second duration), the second clock signal C2 remains at logic high state, and the first, third, and tenth clock signals C1, C3, and C10 remain at logic low state. Thus, the second switch S2 remains activated, and the first, third, and seventh switches S1, S3, and S7 remain deactivated. The second switch S2 performs sampling of the analog input signal Vin. Further, the second DAC 108*b* receives the sampled analog input signal Vin and generates the second analog output signal A2. During time period T14-T16 (i.e., during the fourth duration), the first conversion circuit 110*a* performs conversion of the first analog output signal A1 to generate the first digital signal D1.

At time instance T16, the second clock signal C2 transitions from logic high state to logic low state and the tenth clock signal C10 transitions from logic low state to logic high state, thereby deactivating the second switch S2 and activating the seventh switch S7. During time period T16-T17 (i.e., during the tenth duration), the tenth clock signal C10 remains at logic high state, and the first through third clock signals C1-C3 remain at logic low state. Thus, the seventh switch S7 remains activated, and the first through third switches S1-S3 remain deactivated. The seventh switch S7 performs sampling of the analog input signal Vin. Further, the fourth DAC 304 receives the sampled analog input signal Vin and generates the fourth analog output signal A4. During time period T15-T17 (i.e., during the sixth duration), the second conversion circuit 110*b* performs conversion of the third analog output signal A3 to generate the third digital signal D3. During time period T15-T16, as the fourth duration partially overlaps with the sixth duration for one cycle of the input clock signal, the first and second conversion circuits 110*a* and 110*b* simultaneously perform conversion of the first and third analog output signals A1 and A3, respectively. Further, during time period T16-T17 (i.e., during the seventh duration), the first amplifier 114 performs amplification of the first analog output signal A1.

At time instance T17, the tenth clock signal C10 transitions from logic high state to logic low state and the first clock signal C1 transitions from logic low state to logic high state, thereby deactivating the seventh switch S7 and activating the first switch S1, respectively. During time period T17-T18, the first clock signal C1 remains at logic high state, and the second, third, and tenth clock signals C2, C3, and C10 remain at logic low state. The first switch S1 is thus activated and the second, third, and seventh switches S2, S3, and S7 remain deactivated. The first switch S1 performs sampling of the analog input signal yin. Further, the first DAC 108a receives the analog input signal Vin and generates the first analog output signal A1. During time period T16-T18 (i.e., during the fifth duration), the first conversion circuit 110a performs conversion of the second analog output signal A2 to generate the second digital signal D2. During time period T16-T17, as the fifth duration partially overlaps with the sixth duration for one cycle of the input clock signal, the first and second conversion circuits 110a and 110b simultaneously perform conversion of the second and third analog output signals A2 and A3, respectively. Further, during time period T17-T18 (i.e., during the ninth duration), the first amplifier 114 performs amplification of the third analog output signal A3.

During time period T18-T21, the conversion of the first analog output signal A1 and the amplification of the first analog output signal A1 occur in a similar manner as performed during time period T14-T17. Further, the sampling of the analog input signal Vin and the conversion of the third analog output signal A3 occur in a similar manner as performed during time period T14-T17. During time period T18-T19 (i.e., during the eighth duration), the first amplifier 114 performs amplification of the second analog output signal A2.

During time period T17-T19 (i.e., during the eleventh duration), the second conversion circuit 110b performs conversion of the fourth analog output signal A4 to generate the fifth digital signal D5. During time period T17-T18, as the fifth duration partially overlaps with the eleventh duration for one cycle of the input clock signal, the first and second conversion circuits 110a and 110b simultaneously perform conversion of the second and fourth analog output signals A2 and A4, respectively. Further, during time period T18-T19, as the fourth duration partially overlaps with the eleventh duration for one cycle of the input clock signal, the first and second conversion circuits 110a and 110b simultaneously perform conversion of the first and fourth analog output signals A1 and A4, respectively.

During time period T19-T20 (i.e., during the twelfth duration), the first amplifier 114 performs amplification of the fourth analog output signal A4. Further, during time period T19-T20 and during time period 120-T21, the sampling of the analog input signal Vin occurs in a similar manner as performed during time period T15-T16 and during time period 116-T17, respectively.

Figure 5:
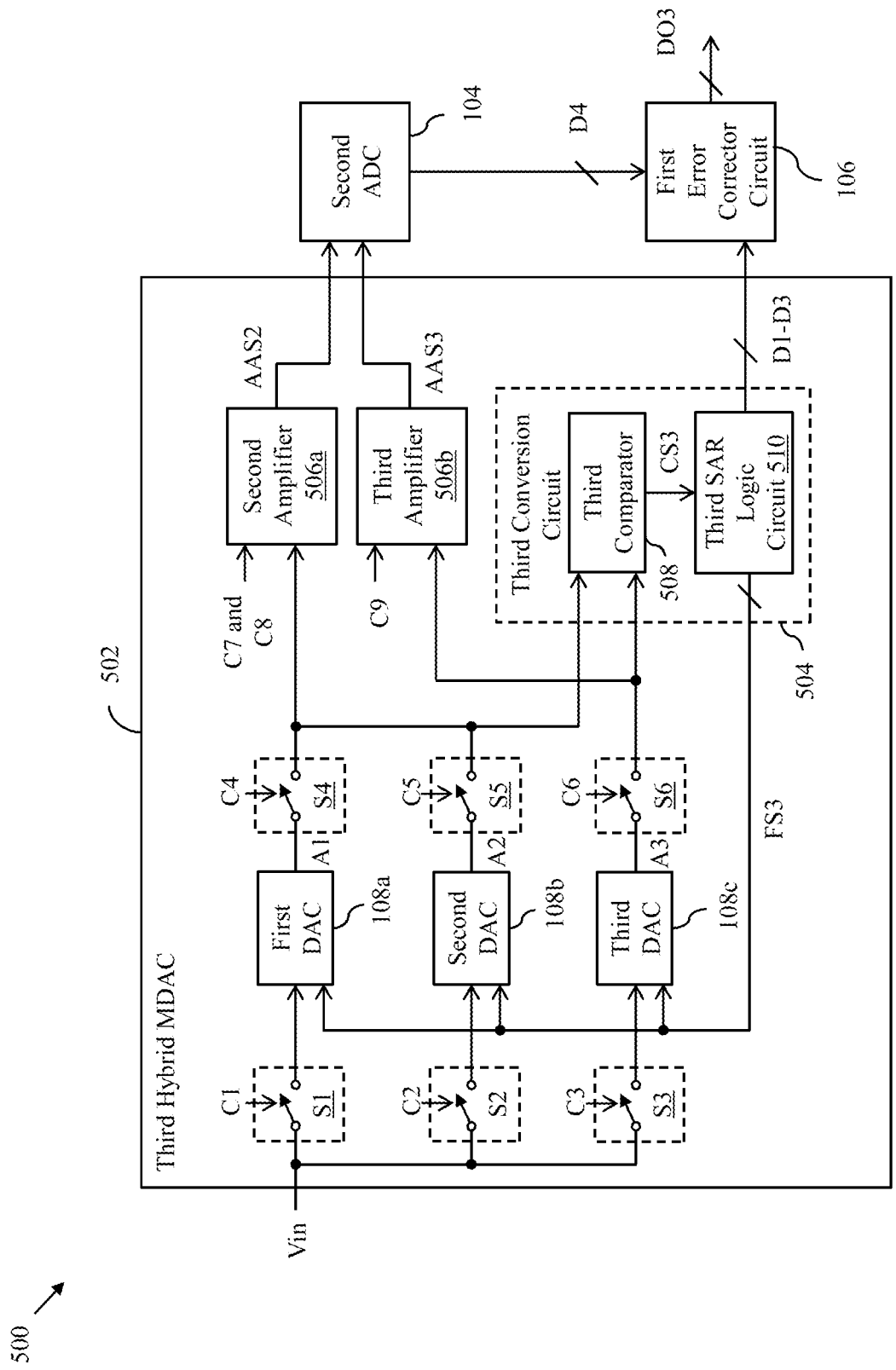
FIG. 5 is a block diagram of a third pipeline ADC in accordance with yet another embodiment of the present disclosure.

FIG. 5 is a block diagram of a third pipeline ADC 500 in accordance with yet another embodiment of the present disclosure. The third pipeline ADC 500 is configured to receive the analog input signal Vin from the first functional circuit. The third pipeline ADC 500 is further configured to convert the analog input signal Vin to generate a third digital output signal DO3. The third pipeline ADC 500 may be further configured to provide the third digital output signal DO3 to the second functional circuit.

The third pipeline ADC 500 is a hybrid pipeline ADC that includes a third hybrid MDAC 502, the second ADC 104, and the first error corrector circuit 106. The third pipeline ADC 500 may further include the first clock generator circuit. The first clock generator circuit functions in a similar manner as described in FIG. 1.

The third hybrid MDAC 502 is coupled with the first functional circuit, and configured to receive the analog input signal Vin. Based on the analog input signal Vin, the third hybrid MDAC 502 generates the first through third digital signals D1-D3 during the fourth through sixth durations of the input clock signal, respectively. The third hybrid MDAC 502 is further configured to generate second and third amplified analog signals AAS2 and AAS3. The MSBs of the third digital output signal DO3 correspond to at least one of the first through third sets of bits. The third hybrid MDAC 502 includes the first through sixth switches S1-S6, the first through third DACs 108a-108c, a third conversion circuit 504, and second and third amplifiers 506a and 506b. The first through third switches S1-S3 function in a similar manner as described in FIG. 1.

The first through third DACs 108a-108c are coupled with the first through third switches S1-S3, respectively, and receive the sampled analog input signal Vin during the first through third durations. Further, the first through third DACs 108a-108c generate the first through third analog output signals A1-A3 on receiving the sampled analog input signal Vin. The first through third DACs 108a-108c are further configured to receive a third feedback signal FS3. The third feedback signal FS3 controls the first through third DACs 108a-108c to generate the first through third analog output signals A1-A3, respectively.

The fourth through sixth switches S4-S6 are coupled with the first through third DACs 108a-108c, respectively, and configured to receive the first through third analog output signals A1-A3, respectively. The fourth and fifth switches S4 and S5 are further coupled with the third conversion circuit 504 and the second amplifier 506a, and further configured to provide the first and second analog output signals A1 and A2, respectively, to the third conversion circuit 504 and the second amplifier 506a. The sixth switch S6 is coupled with the third conversion circuit 504 and the third amplifier 506b, and further configured to provide the third analog output signal A3 to the third conversion circuit 504 and the third amplifier 506b.

The third conversion circuit 504 is coupled with the first through third DACs 108a-108c by way of the fourth through sixth switches S4-S6, respectively, and configured to receive at least one of the first through third analog output signals A1-A3. The third conversion circuit 504 is further configured to convert at least one of the first through third analog output signals A1-A3 to generate at least one of the first through third digital signals D1-D3 in the fourth through sixth durations, respectively. Further, the third conversion circuit 504 is configured to generate and provide the third feedback signal FS3 to the first through third DACs 108a-108c to control the first through third DACs 108a-108c, respectively.

The third conversion circuit 504 includes a third comparator 508 and a third SAR logic circuit 510. The third comparator 508 is coupled with the fourth through sixth switches S4-S6. Thus, the third comparator 508 is coupled with the first through third DACs 108a-108c by way of the fourth through sixth switches S4-S6, respectively, and configured to receive the first through third analog output signals A1-A3. The third comparator 508 is further configured to generate a third comparison signal CS3 based on at least one of the first through third analog output signals A1-A3 in a manner similar to the generation of the first comparison signal CS1 by the first comparator 116a.

The third SAR logic circuit 510 is coupled with the third comparator 508 and the first through third DACs 108a-108c. The third SAR logic circuit 510 is configured to receive the third comparison signal CS3. The third comparator 508 and the third SAR logic circuit 510 are configured to successively approximate at least one of the first through third analog output signals A1-A3 to generate at least one of the first through third digital signals D1-D3, respectively. The third SAR logic circuit 510 is further configured to generate the third feedback signal FS3 at each cycle of a third comparison clock signal, and provide the third feedback signal FS3 to the first through third DACs 108a-108c.

The second amplifier 506a is coupled with the first and second DACs 108a and 108b by way of the fourth and fifth switches S4 and S5, respectively, and configured to receive the first and second analog output signals A1 and A2. The second amplifier 506a is further configured to receive the seventh and eighth clock signals C7 and C8. The seventh and eighth clock signals C7 and C8 control an amplification operation of the second amplifier 506a. The second amplifier 506a is further configured to amplify at least one of the first and second analog output signals A1 and A2 to generate a second amplified analog signal AAS2 during the seventh and eighth durations of the input clock signal, respectively. The second amplifier 506a amplifies at least one of the first and second analog output signals A1 and A2 after the third conversion circuit 504 generates at least one of the first and second digital signals D1 and D2, respectively.

The third amplifier 506b is coupled with the third DAC 108c by way of the sixth switch S6, and configured to receive the third analog output signal A3. The third amplifier 506b is further configured to receive the ninth clock signal C9. The ninth clock signal C9 controls an amplification operation of the third amplifier 506b. The third amplifier 506b is further configured to amplify the third analog output signal A3 to generate a third amplified analog signal AAS3 during the ninth duration of the input clock signal. The third amplifier 506b amplifies the third analog output signal A3 after the third conversion circuit 504 generates the third digital signal D3.

The second ADC 104 is coupled with the second and third amplifiers 506a and 506b, and configured to receive at least one of the second and third amplified analog signals AAS2 and AAS3. The second ADC 104 generates the fourth digital signal D4 by converting at least one of the second and third amplified analog signals AAS2 and AAS3. The fourth digital signal D4 includes the fourth set of bits such that LSBs of the third digital output signal DO3 correspond to the fourth set of bits.

The first error corrector circuit 106 is coupled with the second ADC 104 and the third conversion circuit 504, and configured to receive the fourth digital signal D4 and at least one of the first through third digital signals D1-D3. The first error corrector circuit 106 generates the third digital output signal DO3 based on the fourth digital signal D4 and at least one of the first through third digital signals D1-D3 in a manner similar to the generation of the first digital output signal DO1 as described in FIG. 1.

Figure 6:
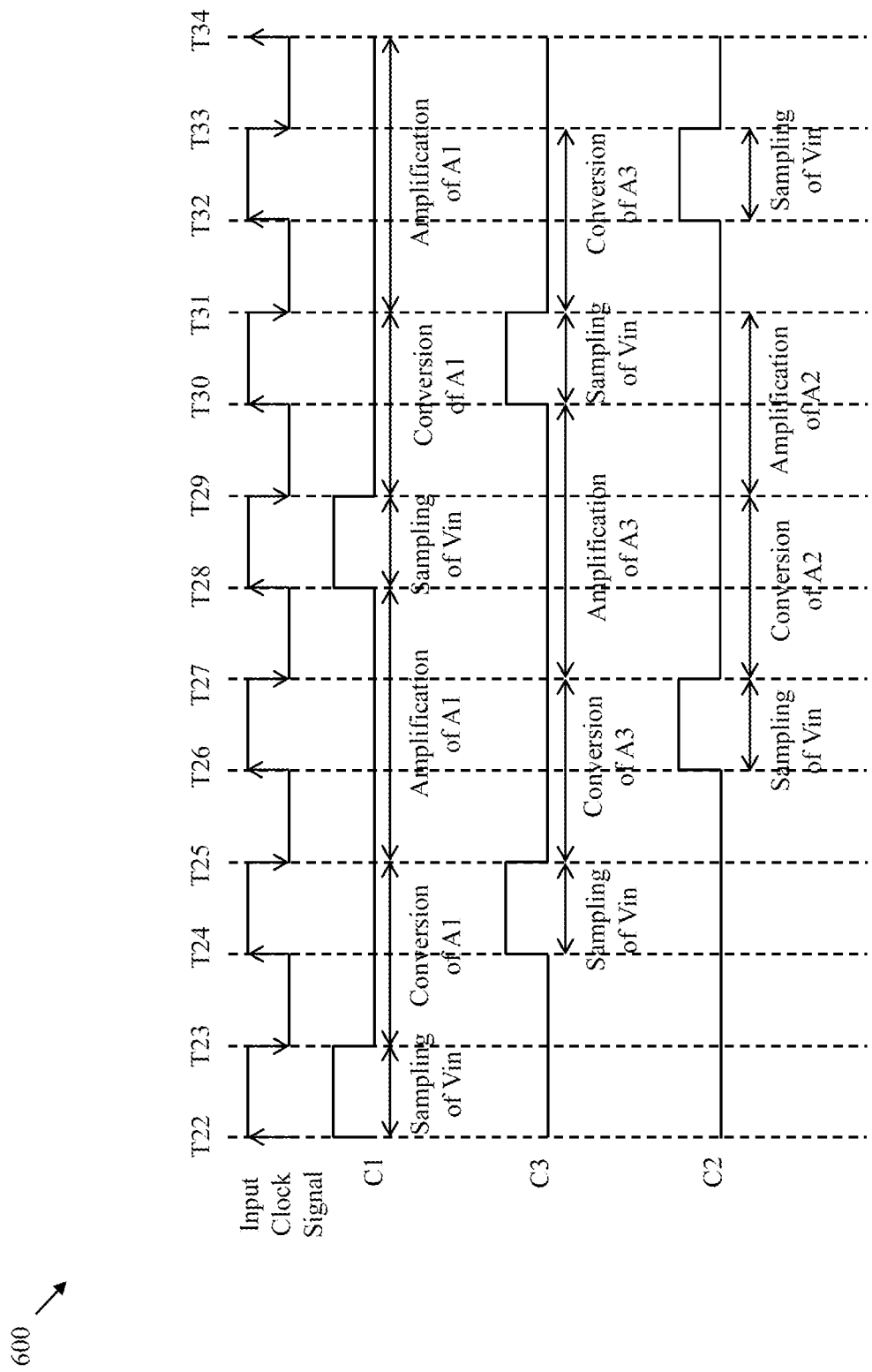
FIG. 6 is a timing diagram that illustrates an operation of the third pipeline ADC of FIG. 5 in accordance with yet another embodiment of the present disclosure.

FIG. 6 is a timing diagram 600 illustrating an operation of the third pipeline ADC 500 in accordance with yet another embodiment of the present disclosure. In the embodiment, the first through third durations are non-overlapping durations. Further, the fourth through sixth durations are non-overlapping durations. Furthermore, the seventh and eighth durations are non-overlapping durations. The ninth duration partially overlaps with at least one of the seventh and eighth durations. In the current embodiment, the ninth duration and at least one of the seventh and eighth durations partially overlap for half cycle of the input clock signal. Each of the first through third durations corresponds to a half cycle of the input clock signal, and each of the fourth through sixth durations corresponds to one cycle of the input clock signal. Further, each of the seventh and ninth durations corresponds to one and a half cycle of the input clock signal, and the eighth duration corresponds to one cycle of the input clock signal.

The transitioning of the first through third clock signals C1-C3, and the activation and deactivation of the first through third switches S1-S3 occurs in a similar manner as described in FIG. 2. During time period T22-T23 (i.e., during the first duration), the first switch S1 performs sampling of the analog input signal Vin. Further, the first DAC 108a receives the analog input signal Vin and generates the first analog output signal A1.

During time period T23-T25 (i.e., during the fourth duration), the third conversion circuit 504 performs conversion of the first analog output signal A1 to generate the first digital signal D1. During time period T24-T25 (i.e., during the third duration), the third switch S3 performs sampling of the analog input signal Vin. Further, the third DAC 108c receives the sampled analog input signal Vin and generates the third analog output signal A3.

During time period T25-T27 (i.e., during the sixth duration), the third conversion circuit 504 performs conversion of the third analog output signal A3 to generate the third digital signal D3. During time period T26-T27 (i.e., during the second duration), the second switch S2 performs sampling of the analog input signal Vin. Further, the second DAC 108b receives the sampled analog input signal Vin and generates the second analog output signal A2.

During time period T25-T28 (i.e., during the seventh duration), the second amplifier 506a performs amplification of the first analog output signal A1. During time period T28-T29, the first switch S1 performs sampling of the analog input signal Vin. Further, the first DAC 108a receives the analog input signal Vin and generates the first analog output signal A1. Further, during time period T27-T29 (i.e., during the fifth duration), the first conversion circuit 110a performs conversion of the second analog output signal A2 to generate the second digital signal D2.

During time period T27-T30 (i.e., during the ninth duration), the third amplifier 506b performs amplification of the third analog output signal A3. During time period T27-T28, as the seventh duration partially overlaps with the ninth duration for half cycle of the input clock signal, the second and third amplifiers 506a and 506b simultaneously perform amplification of the first and third analog output signals A1 and A3, respectively.

During time period T29-T34, the conversion of the first analog output signal A1 and the amplification of the first analog output signal A1 occur in a similar manner as performed during time period T23-T28. During time period T29-T31 (i.e., during the eighth duration), the second amplifier 506a performs amplification of the second analog output signal A2. Further, during time period T29-T30, as the eighth duration partially overlaps with the ninth duration for half cycle of the input clock signal, the second and third amplifiers 506a and 506b simultaneously perform amplification of the second and third analog output signals A2 and A3, respectively.

During time period T30-T33, the sampling of the analog input signal Vin and the conversion of the third analog output signal A3 occur in a similar manner as performed during time period T24-T27. Further, during time period T32-T33, the sampling of the analog input signal Vin occurs in a similar manner as performed during time period T26-T27.

Figure 7:
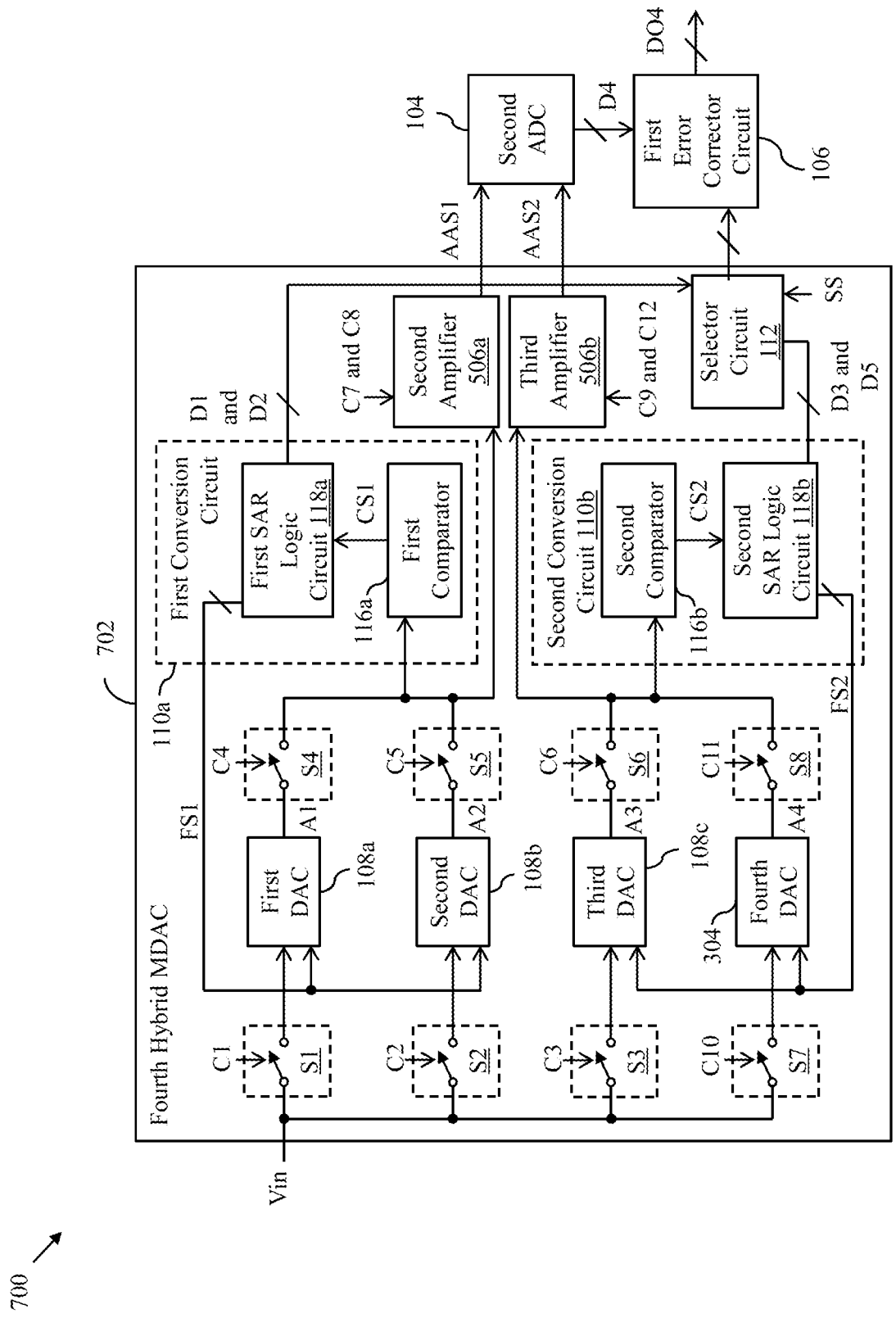
FIG. 7 is a block diagram of a fourth pipeline ADC in accordance with yet another embodiment of the present disclosure.

FIG. 7 is a block diagram of a fourth pipeline ADC 700 in accordance with yet another embodiment of the present disclosure. The fourth pipeline ADC 700 is configured to receive the analog input signal Vin from the first functional circuit. The fourth pipeline ADC 700 is further configured to convert the analog input signal yin to generate a fourth digital output signal DO4. The fourth pipeline ADC 700 may be further configured to provide the fourth digital output signal DO4 to the second functional circuit.

The fourth pipeline ADC 700 is a hybrid pipeline ADC that includes a fourth hybrid MDAC 702, the second ADC 104, and the first error corrector circuit 106. The fourth pipeline ADC 700 may further include the first clock generator circuit. The first clock generator circuit functions in a similar manner as described in FIGS. 1 and 3.

The fourth hybrid MDAC 702 is coupled with the first functional circuit, and configured to receive the analog input signal Vin. Based on the analog input signal yin, the fourth hybrid MDAC 702 is further configured to generate the first through third digital signals D1-D3 and the fifth digital signal D5 during the fourth through sixth durations and the eleventh duration of the input clock signal, respectively. The fourth hybrid MDAC 702 is further configured to generate second and third amplified analog signals AAS2 and AAS3. The fourth hybrid MDAC 702 includes the first through eighth switches S1-S8, the first through third DACs 108*a*-108*c*, the fourth DAC 304, the first and second conversion circuits 110*a* and 110*b*, the selector circuit 112, and the second and third amplifiers 506*a* and 506*b*. The first through third switches S1-S3 and the seventh switch S7 function in a similar manner as described in FIGS. 1 and 3. Further, the first through third DACs 108*a*-108*c* and the fourth DAC 304 function in a similar manner as described in FIGS. 1 and 3.

The fourth through sixth switches S4-S6 and the eighth switch S8 are coupled with the first through third DACs 108*a*-108*c* and the fourth DAC 304, respectively, and configured to receive the first through third analog output signals A1-A3 and the fourth analog output signal A4, respectively. The fourth and fifth switches S4 and S5 are further coupled with the first conversion circuit 110*a* and the second amplifier 506*a*, and further configured to provide the first and second analog output signals A1 and A2, respectively, to the first conversion circuit 110*a* and the second amplifier 506*a*. The sixth and eighth switches S6 and S8 are coupled with the second conversion circuit 110*b* and the third amplifier 506*b*, and further configured to provide the third and fourth analog output signals A3 and A4, respectively, to the second conversion circuit 110*b* and the third amplifier 506*b*.

The first and second conversion circuits 110*a* and 110*b* function in a similar manner as described in FIG. 3. Further, the second amplifier 506*a* functions in a similar manner as described in FIG. 5. The third amplifier 506*b* is coupled with the third DAC 108*c* and the fourth DAC 304 by way of the sixth and eighth switches S6 and S8, respectively, and configured to receive the third and fourth analog output signals A3 and A4. The third amplifier 506*b* is further configured to receive the ninth and twelfth clock signals C9 and C12. The ninth and twelfth clock signals C9 and C12 control an amplification operation of the third amplifier 506*b*. The third amplifier 506*b* is further configured to amplify at least one of the third and fourth analog output signals A3 and A4 to generate the third amplified analog signal AAS3 during the ninth and twelfth durations of the input clock signal, respectively. The third amplifier 506*b* amplifies at least one of the third and fourth analog output signals A3 and A4 after the second conversion circuit 110*b* generates at least one of the third and fifth digital signals D3 and D5, respectively.

The second ADC 104 functions in a similar manner as described in FIG. 5 to generate the fourth digital signal D4. The fourth digital signal D4 includes the fourth set of bits such that LSBs of the fourth digital output signal DO4 correspond to the fourth set of bits. Further, the selector circuit 112 and the first error corrector circuit 106 function in a similar manner as described in FIG. 3 to generate the fourth digital output signal DO4.

Figure 8:
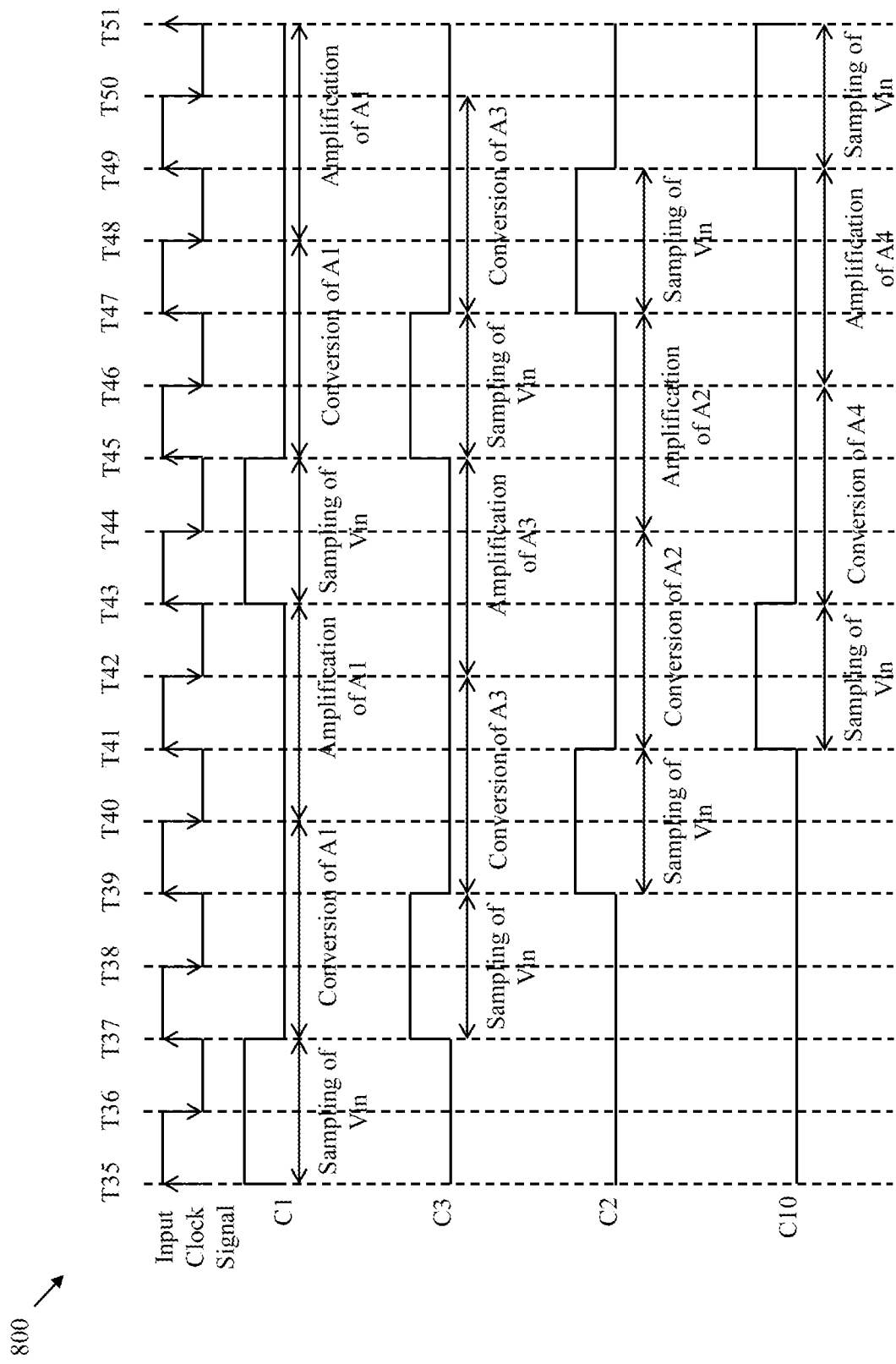
FIG. 8 is a timing diagram that illustrates an operation of the fourth pipeline ADC of FIG. 7 in accordance with yet another embodiment of the present disclosure.

FIG. 8 is a timing diagram 800 illustrating an operation of the fourth pipeline ADC 700 in accordance with yet another embodiment of the present disclosure. In the embodiment, the first through third durations and the tenth duration are non-overlapping durations. Further, the fourth and fifth durations are non-overlapping durations, and the sixth and eleventh durations are non-overlapping durations. The sixth and eleventh durations partially overlap with at least one of the fourth and fifth durations. In the current embodiment, the sixth and eleventh durations and at least one of the fourth and fifth durations partially overlap for half cycle of the input clock signal. Furthermore, the seventh and eighth durations are non-overlapping durations, and the ninth and twelfth durations are non-overlapping durations. The ninth and twelfth durations partially overlap with at least one of the seventh and eighth durations. In the current embodiment, the ninth and twelfth durations and at least one of the seventh and eighth durations partially overlap for half cycle of the input clock signal. Each of the first through third durations and the tenth duration corresponds to one cycle of the input clock signal, and each of the fourth through sixth durations and the eleventh duration corresponds to one and a half cycle of the input clock signal. Further, each of the seventh through ninth durations and the twelfth duration corresponds to one and a half cycle of the input clock signal.

The transitioning of the first through third clock signals C1-C3 and the tenth clock signal C10, and the activation and deactivation of the first through third switches S1-S3 and the seventh switch S7 occur in a similar manner as described in FIG. 4. During time period T35-T37 (i.e., during the first duration), the first switch S1 performs sampling of the analog input signal Vin. Further, the first DAC 108*a* receives the analog input signal Vin and generates the first analog output signal A1.

During time period T37-T39 (i.e., during the third duration), the third switch S3 performs sampling of the analog input signal Vin. Further, the third DAC 108*c* receives the sampled analog input signal Vin and generates the third analog output signal A3. During time period T39-T41 (i.e., during the second duration), the second switch S2 performs sampling of the analog input signal Vin. Further, the second DAC 108*b* receives the sampled analog input signal Vin and generates the second analog output signal A2. During time period T37-T40 (i.e., during the fourth duration), the first conversion circuit 110*a* performs conversion of the first analog output signal A1 to generate the first digital signal D1.

During time period T41-T43 (i.e., during the tenth duration), the seventh switch S7 performs sampling of the analog input signal yin. Further, the fourth DAC 304 receives the sampled analog input signal Vin and generates the fourth analog output signal A4. During time period T39-T42 (i.e., during the sixth duration), the second conversion circuit 110*b* performs conversion of the third analog output signal A3 to generate the third digital signal D3. During time period T39-T40, as the fourth duration partially overlaps with the sixth duration for half cycle of the input clock signal, the first and second conversion circuits 110*a* and 110*b* simultaneously perform conversion of the first and third analog output signals A1 and A3, respectively.

During time period T43-T45, the first switch S1 performs sampling of the analog input signal Vin. Further, the first DAC 108*a* receives the analog input signal Vin and generates the first analog output signal A1. During time period T42-T45 (i.e., during the ninth duration), the third amplifier 506*b* performs amplification of the third analog output signal A3. Further, during time period T42-T43, as the seventh duration partially overlaps with the ninth duration for half cycle of the input clock signal, the second and third amplifiers 506*a* and 506*b* simultaneously perform amplification of the first and third analog output signals A1 and A3, respectively.

During time period T41-T44 (i.e., during the fifth duration), the first conversion circuit 110*a* performs conversion of the second analog output signal A2 to generate the second digital signal D2. During time period T41-T42, as the fifth duration partially overlaps with the sixth duration for half cycle of the input clock signal, the first and second conversion circuits 110*a* and 110*b* simultaneously perform conversion of the second and third analog output signals A2 and A3, respectively.

During time period T45-T51, the conversion of the first analog output signal A1 and the amplification of the first analog output signal A1 occur in a similar manner as performed during time period T37-T43. Further, during time period T45-T50, the sampling of the analog input signal Vin and the conversion of the third analog output signal A3 occur in a similar manner as performed during time period T37-T42.

During time period T43-T46 (i.e., during the eleventh duration), the second conversion circuit 110*b* performs conversion of the fourth analog output signal A4 to generate the fifth digital signal D5. Further, during time period T43-T44, as the fifth duration partially overlaps with the eleventh duration for half cycle of the input clock signal, the first and second conversion circuits 110*a* and 110*b* simultaneously perform conversion of the second and fourth analog output signals A2 and A4, respectively. Furthermore, during time period T45-T46, as the fourth duration partially overlaps with the eleventh duration for half cycle of the input clock signal, the first and second conversion circuits 110*a* and 110*b* simultaneously perform conversion of the first and fourth analog output signals A1 and A4, respectively.

During time period T44-T47 (i.e., during the eighth duration), the second amplifier 506*a* performs amplification of the second analog output signal A2. Further, during time period T44-T45, as the eighth duration partially overlaps with the ninth duration for half cycle of the input clock signal, the second and third amplifiers 506*a* and 506*b* simultaneously perform amplification of the second and third analog output signals A2 and A3, respectively.

During time period T46-T49 (i.e., during the twelfth duration), the third amplifier 506*b* performs amplification of the fourth analog output signal A4. Further, during time period T46-T47, as the eighth duration partially overlaps with the twelfth duration for half cycle of the input clock signal, the second and third amplifiers 506*a* and 506*b* simultaneously perform amplification of the second and fourth analog output signals A2 and A4, respectively. Furthermore, during time period T48-T49, as the seventh duration partially overlaps with the twelfth duration for half cycle of the input clock signal, the second and third amplifiers 506*a* and 506*b* simultaneously perform amplification of the first and fourth analog output signals A1 and A4, respectively.

During time period T47-T49 and during time period T49-T51, the sampling of the analog input signal Vin occurs in a similar manner as performed during time period T39-T41 and the time period T41-T43, respectively.

Figure 9:
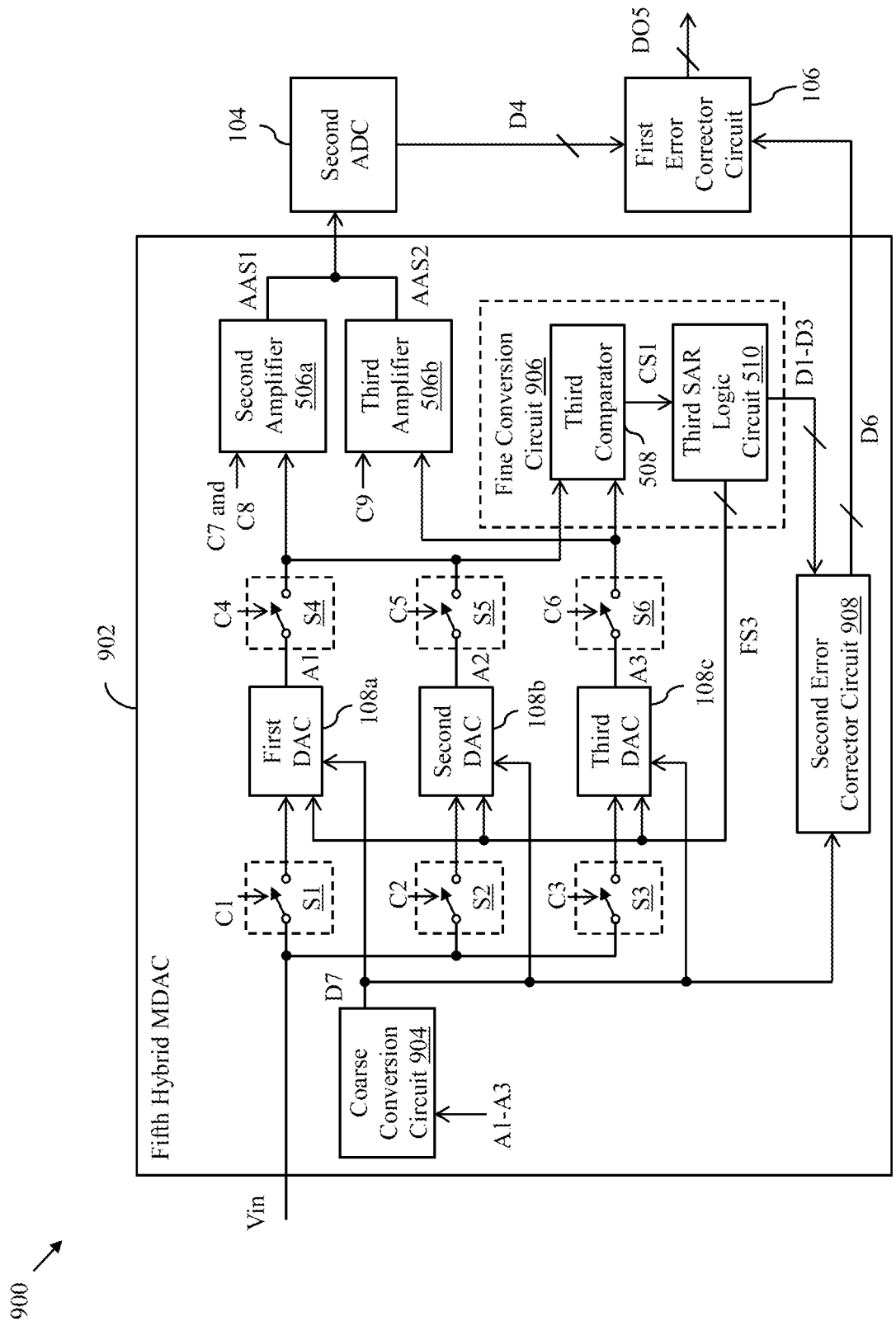
FIG. 9 is a block diagram of a fifth pipeline ADC in accordance with yet another embodiment of the present disclosure.

FIG. 9 is a block diagram of a fifth pipeline ADC 900 in accordance with yet another embodiment of the present disclosure. The fifth pipeline ADC 900 is configured to receive the analog input signal Vin from the first functional circuit. The fifth pipeline ADC 900 is further configured to convert the analog input signal Vin to generate a fifth digital output signal DO5. The fifth pipeline ADC 900 may be further configured to provide the fifth digital output signal DO5 to the second functional circuit.

The fifth pipeline ADC 900 is a hybrid pipeline ADC that includes a fifth hybrid MDAC 902, the second ADC 104, and the first error corrector circuit 106. The fifth pipeline ADC 900 may further include the first clock generator circuit. The first clock generator circuit functions in a similar manner as described in FIG. 1. The fifth hybrid MDAC 902 is coupled with the first functional circuit, and configured to receive the analog input signal Vin. Based on the analog input signal Vin, the fifth hybrid MDAC 902 is further configured to generate a sixth digital signal D6. The sixth digital signal D6 includes a sixth set of bits such that MSBs of the fifth digital output signal DO5 correspond to the sixth set of bits. The fifth hybrid MDAC 902 is further configured to generate the second and third amplified analog signals AAS2 and AAS3. The fifth hybrid MDAC 902 includes a coarse conversion circuit 904, the first through sixth switches S1-S6, the first through third DACs 108*a*-108*c*, a fine conversion circuit 906, a second error corrector circuit 908, and the second and third amplifiers 506*a* and 506*b*.

The coarse conversion circuit 904 is configured to receive a set of analog signals (such as the first through third analog output signals A1-A3) and perform coarse conversion to generate a seventh digital signal D7. In one example, the set of analog signals includes the analog input signal Vin. In another example, the set of analog signals includes the first through third analog output signals A1-A3. In one example, the coarse conversion circuit 904 is any ADC, such as a flash ADC, and configured to covert the analog input signal Vin to generate the seventh digital signal D7. In another example, the coarse conversion circuit 904 includes a fourth comparator (not shown) and a fourth SAR logic circuit (not shown) that function in a manner similar to the third comparator 508 and the third SAR logic circuit 510 as described in FIG. 5. The fourth comparator and the fourth SAR logic circuit are configured to successively approximate the first through third analog output signals A1-A3 to generate the seventh digital signal D7. The seventh digital signal D7 includes a seventh set of bits such that MSBs of the sixth digital signal D6 correspond to the seventh set of bits.

The first through third switches S1-S3 function in a similar manner as described in FIG. 1. The first through third DACs 108*a*-108*c* are coupled with the first through third switches S1-S3, and receive the sampled analog input signal Vin during the first through third durations, respectively. The first through third DACs 108*a*-108*c* are further coupled with the coarse conversion circuit 904 to receive the seventh digital signal D7. Further, the first through third DACs 108*a*-108*c* generate the first through third analog output signals A1-A3 on receiving the sampled analog input signal Vin and the seventh digital signal D7. The first through third DACs 108*a*-108*c* are further configured to receive the third feedback signal FS3. The third feedback signal FS3 controls the first through third DACs 108*a*-108*c* to generate the first through third analog output signals A1-A3, respectively.

The fourth through sixth switches S4-S6 are coupled with the first through third DACs 108*a*-108*c*, respectively, and configured to receive the first through third analog output signals A1-A3, respectively. The fourth and fifth switches S4 and S5 are further coupled with the fine conversion circuit 906 and the second amplifier 506*a*, and further configured to provide the first and second analog output signals A1 and A2, respectively, to the fine conversion circuit 906 and the second amplifier 506*a*. The sixth switch S6 is further coupled with the fine conversion circuit 906 and the third amplifier 506*b*, and further configured to provide the third analog output signal A3 to the fine conversion circuit 906 and the third amplifier 506*b*.

The fine conversion circuit 906 is coupled with the first through third DACs 108*a*-108*c* by way of the fourth through sixth switches S4-S6, respectively, and configured to receive at least one of the first through third analog output signals A1-A3. The fine conversion circuit 906 is further configured to perform fine conversion of at least one of the first through third analog output signals A1-A3 to generate at least one of the first through third digital signals D1-D3 in the fourth through sixth durations, respectively. Further, the fine conversion circuit 906 is configured to generate and provide the third feedback signal FS3 to the first through third DACs 108*a*-108*c* to control the first through third DACs 108*a*-108*c*, respectively. The first through third digital signals D1-D3 include the first through third sets of bits such that LSBs of the sixth digital signal D6 correspond to at least one of the first through third sets of bits.

The fine conversion circuit 906 includes the third comparator 508 and the third SAR logic circuit 510 that function in a similar manner as described in FIG. 5. The second error corrector circuit 908 is coupled with the coarse conversion circuit 904 and the third SAR logic circuit 510, and configured to receive the seventh digital signal D7 and at least one of the first through third digital signals D1-D3. The second error corrector circuit 908 is further configured to generate the sixth digital signal D6 based on the seventh digital signal D7 and at least one of the first through third digital signals D1-D3 in a manner similar to the generation of the first digital output signal DO1 as described in FIG. 1. Further, the second and third amplifiers 506*a* and 506*b* function in a similar manner as described in FIG. 5.

The second ADC 104 functions in a similar manner as described in FIG. 5 to generate the fourth digital signal D4. The fourth digital signal D4 includes the fourth set of bits such that LSBs of the fifth digital output signal DO5 correspond to the fourth set of bits. The first error corrector circuit 106 is coupled with the second error corrector circuit 908 and the second ADC 104, and configured to receive the sixth and seventh digital signals D6 and D7. The first error corrector circuit 106 is further configured to generate the fifth digital output signal DO5 based on the sixth and seventh digital signals D6 and D7 in a manner similar to the generation of the first digital output signal DO1 as described in FIG. 1.

Figure 10:
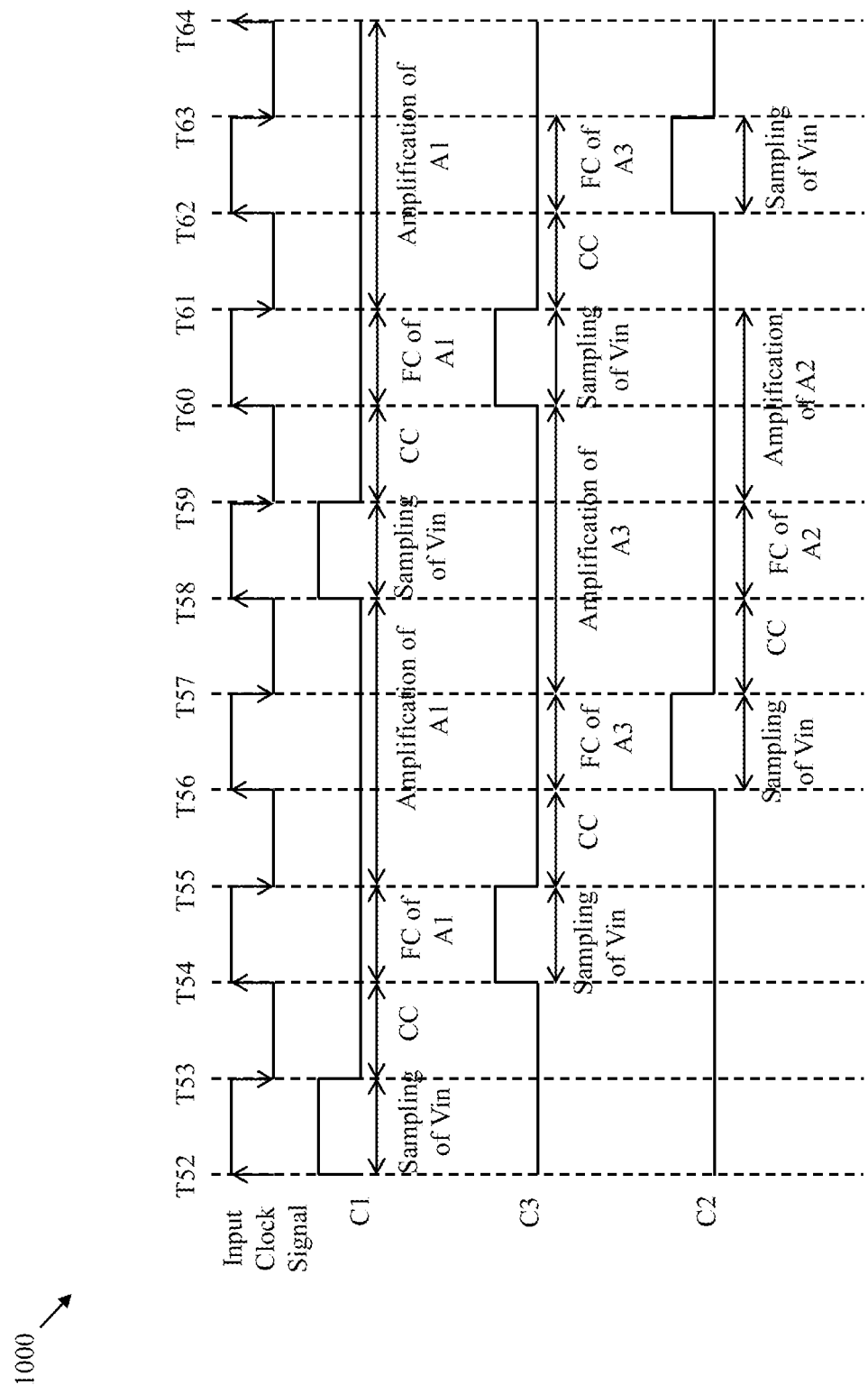
FIG. 10 is a timing diagram that illustrates an operation of the fifth pipeline ADC of FIG. 9 in accordance with yet another embodiment of the present disclosure.

FIG. 10 is a timing diagram 1000 illustrating an operation of the fifth pipeline ADC 900 in accordance with yet another embodiment of the present disclosure. In the embodiment, each of the first through third durations corresponds to a half cycle of the input clock signal, and each of the fourth through sixth durations corresponds to half cycle of the input clock signal. Further, each of the seventh and ninth durations corresponds to one and a half cycle of the input clock signal, and the eighth duration corresponds to one cycle of the input clock signal.

The transitioning of the first through third clock signals C1-C3, and the activation and deactivation of the first through third switches S1-S3 occurs in a similar manner as described in FIG. 2. During time period T52-T53 (i.e., during the first duration), the first switch S1 performs sampling of the analog input signal Vin. Further, the first DAC 108*a* receives the analog input signal Vin and generates the first analog output signal A1.

During time period T53-T54, the coarse conversion circuit 904 performs coarse conversion (represented as "CC" in FIG. 10) of the first analog output signal A1 to generate the seventh digital signal D7. During time period T54-T55 (i.e., during the fourth duration), the fine conversion circuit 906 performs fine conversion (represented as "FC" in FIG. 10) of the first analog output signal A1 to generate the first digital signal DI. During time period T54-T55 (i.e., during the third duration), the third switch S3 performs sampling of the analog input signal Vin. Further, the third DAC 108*c* receives the sampled analog input signal Vin and generates the third analog output signal A3.

During time period T55-T56, the coarse conversion circuit 904 performs coarse conversion (represented as "CC" in FIG. 10) of the third analog output signal A3 to generate the seventh digital signal D7. During time period T56-T57 (i.e., during the sixth duration), the fine conversion circuit 906 performs fine conversion (represented as "FC" in FIG. 10) of the third analog output signal A3 to generate the third digital signal D3. During time period T56-T57 (i.e., during the second duration), the second switch S2 performs sampling of the analog input signal Vin. Further, the second DAC 108*b* receives the sampled analog input signal Vin and generates the second analog output signal A2.

During time period T55-T58 (i.e., during the seventh duration), the second amplifier 506*a* performs amplification of the first analog output signal A1. During time period T58-T59, the first switch S1 performs sampling of the analog input signal Vin. Further, the first DAC 108*a* receives the analog input signal Vin and generates the first analog output signal A1. Further, during time period T57-T58, the coarse conversion circuit 904 performs coarse conversion (represented as "CC" in FIG. 10) of the second analog output signal A2 to generate the seventh digital signal D7. During time period T58-T59 (i.e., during the fifth duration), the fine conversion circuit 906 performs fine conversion (represented as "FC" in FIG. 10) of the second analog output signal A2 to generate the second digital signal D2.

During time period T57-T60 (i.e., during the ninth duration), the third amplifier 506*b* performs amplification of the third analog output signal A3. During time period T57-T58, as the seventh duration partially overlaps with the ninth duration for half cycle of the input clock signal, the second and third amplifiers 506*a* and 506*b* simultaneously perform amplification of the first and third analog output signals A1 and A3, respectively.

During time period T59-T64, the coarse and fine conversions of the first analog output signal A1 and the amplification of the first analog output signal A1 occur in a similar manner as performed during time period T53-T58. During time period T59-T61 (i.e., during the eighth duration), the second amplifier 506*a* performs amplification of the second analog output signal A2. Further, during time period T59-T60, as the eighth duration partially overlaps with the ninth duration for half cycle of the input clock signal, the second and third amplifiers 506a and 506b simultaneously perform amplification of the second and third analog output signals A2 and A3, respectively.

During time period T60-T63, the sampling of the analog input signal Vin and the coarse and fine conversions of the third analog output signal A3 occur in a similar manner as performed during time period T54-T57. Further, during time period T62-T63, the sampling of the analog input signal Vin occurs in a similar manner as performed during time period T56-T57.

The first through fifth pipeline ADCs 100, 300, 500, 700, and 900 utilize at least one full cycle of the input clock signal to perform conversion and amplification operations as compared to half cycle of an input clock signal that are utilized for performing conversion and amplification operations by the conventional pipeline ADCs. As need for implementing high powered components (that perform the aforementioned operations in half cycle of the clock signal) in the first through fifth pipeline ADCs 100, 300, 500, 700, and 900 is eliminated, the first through fifth pipeline ADCs 100, 300, 500, 700, and 900 consume low power, have low cost, and operate at a higher speed as compared to conventional pipeline ADCs that implement high-powered components. Further, multiple DACs (such as the first through third DACs 108a-108c and the fourth DAC 304) are implemented in a pipeline and partial time-interleaved architecture in a hybrid MDAC (such as the first through fifth hybrid MDACs 102, 302, 502, 702, and 902). Thus, a number of conversion circuits and amplifiers required by the first through fifth pipeline ADCs 100, 300, 500, 700, and 900 is less as compared to implementation of DACs in a fully time-interleaved architecture that requires higher number of conversion circuits and amplifiers. As a result, a size of the first through fifth pipeline ADCs 100, 300, 500, 700, and 900 is less, and hence an area occupied by the first through fifth pipeline ADCs 100, 300, 500, 700, and 900 on an SoC is less as compared to conventional pipeline ADCs that implement the fully time-interleaved architecture.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A pipeline analog-to-digital converter (ADC), comprising:
a first hybrid multiplying digital-to-analog converter (MDAC) that comprises:
first through third digital-to-analog converters (DACs) that are configured to receive an analog input signal during first through third durations of a clock signal, and generate first through third analog output signals, respectively, wherein the first through third durations are non-overlapping durations;
a first conversion circuit that is coupled with the first and second DACs, and configured to receive the first and second analog output signals and generate first and second digital signals during fourth and fifth durations of the clock signal, respectively, wherein the fourth and fifth durations are non-overlapping durations;
a second conversion circuit that is coupled with the third DAC, and configured to receive the third analog output signal and generate a third digital signal during a sixth duration of the clock signal, wherein the sixth duration partially overlaps with at least one of the fourth and fifth durations; and
an amplifier that is coupled with the first through third DACs, and configured to receive the first through third analog output signals and amplify at least one of the first through third analog output signals to generate an amplified analog signal during seventh through ninth durations of the clock signal, respectively, wherein the seventh through ninth durations are non-overlapping durations; and
a second ADC that is coupled with the amplifier, and configured to receive the amplified analog signal and generate a fourth digital signal.

2. The pipeline ADC of claim 1, wherein the first conversion circuit comprises:
a first comparator that is coupled with the first and second DACs, and configured to receive the first and second analog output signals and generate a first comparison signal based on at least one of the first and second analog output signals; and
a first successive approximation register (SAR) logic circuit that is coupled with the first comparator and the first and second DACs, and configured to receive the first comparison signal and generate the first and second digital signals during the fourth and fifth durations, respectively, and generate and provide a first feedback signal to the first and second DACs, wherein the first feedback signal controls the first and second DACs to generate the first and second analog output signals, respectively.

3. The pipeline ADC of claim 1, wherein the second conversion circuit comprises:
a second comparator that is coupled with the third DAC, and configured to receive the third analog output signal and generate a second comparison signal based on the third analog output signal; and
a second SAR logic circuit that is coupled with the second comparator and the third DAC, and configured to receive the second comparison signal and generate the third digital signal during the sixth duration, and generate and provide a second feedback signal to the third DAC, wherein the second feedback signal controls the third DAC to generate the third analog output signal.

4. The pipeline ADC of claim 1, wherein the amplifier amplifies at least one of the first and second analog output signals after the first conversion circuit generates at least one of the first and second digital signals, respectively, and the third analog output signal after the second conversion circuit generates the third digital signal.

5. The pipeline ADC of claim 1, further comprising an error corrector circuit that is coupled with the second ADC and the first and second conversion circuits, and configured to receive the fourth digital signal and at least one of the first through third digital signals, and generate a digital output signal based on the fourth digital signal and at least one of the first through third digital signals, wherein the first through fourth digital signals include first through fourth sets of bits, respectively, and wherein most significant bits (MSBs) of the digital output signal correspond to at least one of the first through third sets of bits, and least significant bits (LSBs) of the digital output signal correspond to the fourth set of bits.

6. The pipeline ADC of claim 5, wherein the first hybrid MDAC further comprises a selector circuit that is coupled with the first and second conversion circuits and the error corrector circuit, and configured to receive the first through third digital signals and a select signal, and select and provide one of the first through third digital signals to the error corrector circuit based on the select signal.

7. The pipeline ADC of claim 1, wherein the first hybrid MDAC further comprises first through third switches that are coupled with the first through third DACs, respectively, and configured to receive the analog input signal and provide the analog input signal to the first through third DACs during the first through third durations, respectively.

8. The pipeline ADC of claim 1, wherein the first hybrid MDAC further comprises:
fourth and fifth switches that are coupled with the first and second DACs, respectively, and the first conversion circuit and the amplifier, wherein the fourth and fifth switches are configured to receive the first and second analog output signals, respectively, and provide, during the fourth and fifth durations, the first and second analog output signals, respectively, to the first conversion circuit and the amplifier; and
a sixth switch that is coupled with the third DAC, the second conversion circuit, and the amplifier, and configured to receive the third analog output signal, and provide, during the sixth duration, the third analog output signal to the second conversion circuit and the amplifier.

9. A pipeline analog-to-digital converter (ADC), comprising:
a first hybrid multiplying digital-to-analog converter (MDAC) that comprises:
first through third digital-to-analog converters (DACs) that are configured to receive an analog input signal during first through third durations of a clock signal, and generate first through third analog output signals, respectively, wherein the first through third durations are non-overlapping durations;
a conversion circuit that is coupled with the first through third DACs, and configured to receive the first through third analog output signals and generate first through third digital signals during fourth through sixth durations of the clock signal, respectively, wherein the fourth through sixth durations are non-overlapping durations;
a first amplifier that is coupled with the first and second DACs, and configured to receive the first and second analog output signals and amplify at least one of the first and second analog output signals to generate a first amplified analog signal during seventh and eighth durations of the clock signal, respectively, wherein the seventh and eighth durations are non-overlapping durations; and
a second amplifier that is coupled with the third DAC, and configured to receive the third analog output signal and amplify the third analog output signal to generate a second amplified analog signal during a ninth duration of the clock signal, wherein the ninth duration partially overlaps with at least one of the seventh and eighth durations; and
a second ADC that is coupled with the first and second amplifiers, and configured to receive at least one of the first and second amplified analog signals and generate a fourth digital signal based on at least one of the first and second amplified analog signals.

10. The pipeline ADC of claim 9, wherein the conversion circuit comprises:
a comparator that is coupled with the first through third DACs, and configured to receive the first through third analog output signals and generate a comparison signal based on at least one of the first through third analog output signals; and
a successive approximation register (SAR) logic circuit that is coupled with the comparator and the first through third DACs, and configured to receive the comparison signal and generate the first through third digital signals during the fourth through sixth durations, respectively, and generate and provide a feedback signal to the first through third DACs, wherein the feedback signal controls the first through third DACs to generate the first through third analog output signals, respectively.

11. The pipeline ADC of claim 9, wherein the first amplifier amplifies at least one of the first and second analog output signals after the conversion circuit generates at least one of the first and second digital signals, respectively, and the second amplifier amplifies the third analog output signal after the conversion circuit generates the third digital signal.

12. The pipeline ADC of claim 9, further comprising an error corrector circuit that is coupled with the second ADC and the conversion circuit, and configured to receive the fourth digital signal and at least one of the first through third digital signals, and generate a digital output signal based on the fourth digital signal and at least one of the first through third digital signals, wherein the first through fourth digital signals include first through fourth sets of bits, respectively, and wherein most significant bits (MSBs) of the digital output signal correspond to at least one of the first through third sets of bits, and least significant bits (LSBs) of the digital output signal correspond to the fourth set of bits.

13. The pipeline ADC of claim 9, wherein the first hybrid MDAC further comprises first through third switches that are coupled with the first through third DACs, respectively, and configured to receive the analog input signal and provide the analog input signal to the first through third DACs during the first through third durations, respectively.

14. The pipeline ADC of claim 9, wherein the first hybrid MDAC further comprises:
fourth and fifth switches that are coupled with the first and second DACs, respectively, the conversion circuit, and the first amplifier, wherein the fourth and fifth switches are configured to receive the first and second analog output signals, respectively, and provide, during the fourth and fifth durations, the first and second analog output signals, respectively, to the conversion circuit and the first amplifier; and
a sixth switch that is coupled with the third DAC, the conversion circuit, and the second amplifier, and configured to receive the third analog output signal, and provide, during the sixth duration, the third analog output signal, to the conversion circuit and the second amplifier.

15. A pipeline analog-to-digital converter (ADC), comprising:
a first hybrid multiplying digital-to-analog converter (MDAC) that comprises:
first through fourth digital-to-analog converters (DACs) that are configured to receive an analog input signal during first through fourth durations of a clock signal, and generate first through fourth analog output signals, respectively, wherein the first through fourth durations are non-overlapping durations;
a first conversion circuit that is coupled with the first and second DACs, and configured to receive the first and second analog output signals and generate first and second digital signals during fifth and sixth durations of the clock signal, respectively, wherein the fifth and sixth durations are non-overlapping durations;

a second conversion circuit that is coupled with the third and fourth DACs, and configured to receive the third and fourth analog output signals and generate third and fourth digital signals during seventh and eighth durations of the clock signal, respectively, wherein the seventh and eighth durations are non-overlapping durations, and wherein the seventh and eighth durations partially overlap with at least one of the fifth and sixth durations; and a first amplifier that is coupled with the first and second DACs, and configured to receive the first and second analog output signals and amplify at least one of the first and second analog output signals to generate a first amplified analog signal during ninth and tenth durations of the clock signal, respectively, wherein the ninth and tenth durations are non-overlapping durations; and a second amplifier that is coupled with the third and fourth DACs, and configured to receive the third and fourth analog output signals and amplify at least one of the third and fourth analog output signals to generate a second amplified analog signal during eleventh and twelfth durations of the clock signal, respectively, wherein the eleventh and twelfth durations are non-overlapping durations, and wherein the eleventh and twelfth durations partially overlap with at least one of the ninth and tenth durations; and a second ADC that is coupled with the first and second amplifiers, and configured to receive at least one of the first and second amplified analog signals and generate a fifth digital signal based on at least one of the first and second amplified analog signals.

16. The pipeline ADC of claim 15, wherein the first conversion circuit comprises:

a first comparator that is coupled with the first and second DACs, and configured to receive the first and second analog output signals and generate a first comparison signal based on at least one of the first and second analog output signals; and a first successive approximation register (SAR) logic circuit that is coupled with the first comparator and the first and second DACs, and configured to receive the first comparison signal and generate the first and second digital signals during the fifth and sixth durations, respectively, and generate and provide a first feedback signal to the first and second DACs, wherein the first feedback signal controls the first and second DACs to generate the first and second analog output signals, respectively.

17. The pipeline ADC of claim 15, wherein the second conversion circuit comprises:

a second comparator that is coupled with the third and fourth DACs, and configured to receive the third and fourth analog output signals and generate a second comparison signal based on at least one of the third and fourth analog output signals; and a second SAR logic circuit that is coupled with the second comparator and the third and fourth DACs, and configured to receive the second comparison signal and generate the third and fourth digital signals during the seventh and eighth durations, respectively, and generate and provide a second feedback signal to the third and fourth DACs, wherein the second feedback signal controls the third and fourth DACs to generate the third and fourth analog output signals, respectively.

18. The pipeline ADC of claim 15, wherein the first amplifier amplifies at least one of the first and second analog output signals after the first conversion circuit generates at least one of the first and second digital signals, respectively, and the second amplifier amplifies at least one of the third and fourth analog output signals after the second conversion circuit generates at least one of the third and fourth digital signals, respectively.

19. The pipeline ADC of claim 15, further comprising an error corrector circuit that is coupled with the second ADC and the first and second conversion circuits, and configured to receive the fifth digital signal and at least one of the first through fourth digital signals, and generate a digital output signal based on the fifth digital signal and at least one of the first through fourth digital signals, wherein the first through fifth digital signals include first through fifth sets of bits, respectively, and wherein most significant bits (MSBs) of the digital output signal correspond to at least one of the first through fourth sets of bits, and least significant bits (LSBs) of the digital output signal correspond to the fifth set of bits.

20. The pipeline ADC of claim 19, wherein the first hybrid MDAC further comprises a selector circuit that is coupled with the first and second conversion circuits and the error corrector circuit, and configured to receive the first through fourth digital signals and a select signal, and select and provide one of the first through fourth digital signals to the error corrector circuit based on the select signal.

* * * * *